US010186630B2

(12) United States Patent
Henley

(10) Patent No.: US 10,186,630 B2
(45) Date of Patent: Jan. 22, 2019

(54) SEED WAFER FOR GAN THICKENING USING GAS- OR LIQUID-PHASE EPITAXY

(71) Applicant: QMAT, Inc., Santa Clara, CA (US)

(72) Inventor: Francois J. Henley, Saratoga, CA (US)

(73) Assignee: QMAT, INC., Santa Clara, CA (US)

( * ) Notice: Subject to any disclaimer, the term of this patent is extended or adjusted under 35 U.S.C. 154(b) by 0 days.

(21) Appl. No.: 15/662,201

(22) Filed: Jul. 27, 2017

(65) Prior Publication Data
US 2018/0040764 A1 Feb. 8, 2018

Related U.S. Application Data

(60) Provisional application No. 62/370,169, filed on Aug. 2, 2016, provisional application No. 62/378,126, filed on Aug. 22, 2016.

(51) Int. Cl.
H01L 21/02 (2006.01)
H01L 33/00 (2010.01)
(Continued)

(52) U.S. Cl.
CPC ...... H01L 33/0079 (2013.01); C23C 16/0209 (2013.01); C23C 16/0227 (2013.01);
(Continued)

(58) Field of Classification Search
CPC ............. H01L 33/0079; H01L 21/2654; H01L 33/007; H01L 21/02623; H01L 21/6835; H01L 21/02425; C23C 16/0227; C23C 16/0209; C23C 16/34; C30B 19/12; C30B 25/183; C30B 29/36; C30B 29/06; C30B 29/406
See application file for complete search history.

(56) References Cited

U.S. PATENT DOCUMENTS 6,013,563 A 1/2000 Henley et al.
6,162,705 A 12/2000 Henley et al.
(Continued)

OTHER PUBLICATIONS

Hans J. Scheel, "Introduction to Liquid Phase Epitaxy", Liquid Phase Epitaxy of Electronic, Optical and Optoelectronic Materials, 2007, pp. 1-19, John Wiley & Sons, Ltd.
(Continued)

Primary Examiner — Michael M Trinh

(57) ABSTRACT

Embodiments relate to fabricating a wafer including a thin, high-quality single crystal GaN layer serving as a template for formation of additional GaN material. A bulk ingot of GaN material is subjected to implantation to form a subsurface cleave region. The implanted bulk material is bonded to a substrate having lattice and/or Coefficient of Thermal Expansion (CTE) properties compatible with GaN. Examples of such substrate materials can include but are not limited to AlN and Mullite. The GaN seed layer is transferred by a controlled cleaving process from the implanted bulk material to the substrate surface. The resulting combination of the substrate and the GaN seed layer, can form a template for subsequent growth of overlying high quality GaN. Growth of high-quality GaN can take place utilizing techniques such as Liquid Phase Epitaxy (LPE) or gas phase epitaxy, e.g., Metallo-Organic Chemical Vapor Deposition (MOCVD) or Hydride Vapor Phase Epitaxy (HVPE).

23 Claims, 9 Drawing Sheets

(51) Int. Cl.

| | |
|---|---|
| *C23C 16/02* | (2006.01) |
| *C23C 16/34* | (2006.01) |
| *C30B 19/12* | (2006.01) |
| *C30B 25/18* | (2006.01) |
| *C30B 29/06* | (2006.01) |
| *C30B 29/36* | (2006.01) |
| *C30B 29/40* | (2006.01) |
| *H01L 21/265* | (2006.01) |
| *H01L 21/324* | (2006.01) |
| *H01L 21/683* | (2006.01) |
| *H01L 21/762* | (2006.01) |

(52) U.S. Cl.
CPC .............. *C23C 16/34* (2013.01); *C30B 19/12* (2013.01); *C30B 25/183* (2013.01); *C30B 25/186* (2013.01); *C30B 29/06* (2013.01); *C30B 29/36* (2013.01); *C30B 29/406* (2013.01); *H01L 21/0245* (2013.01); *H01L 21/0254* (2013.01); *H01L 21/0262* (2013.01); *H01L 21/02425* (2013.01); *H01L 21/02447* (2013.01); *H01L 21/02458* (2013.01); *H01L 21/02488* (2013.01); *H01L 21/02494* (2013.01); *H01L 21/02623* (2013.01); *H01L 21/2654* (2013.01); *H01L 21/3245* (2013.01); *H01L 21/6835* (2013.01); *H01L 21/76251* (2013.01); *H01L 33/007* (2013.01); *H01L 2221/68363* (2013.01); *H01L 2221/68368* (2013.01)

(56) References Cited

U.S. PATENT DOCUMENTS

| | | |
|---|---|---|
| 7,759,220 B2 | 7/2010 | Henley |
| 7,811,900 B2 | 10/2010 | Henley |
| 7,863,157 B2 | 1/2011 | Henley et al. |
| 7,910,458 B2 | 3/2011 | Henley |
| 8,012,852 B2 | 9/2011 | Henley et al. |
| 8,110,480 B2 | 2/2012 | Henley |
| 8,124,499 B2 | 2/2012 | Henley et al. |
| 2003/0186088 A1* | 10/2003 | Kato ........................ C30B 23/02 428/698 |
| 2007/0176210 A1* | 8/2007 | Murphy ............. H01L 21/02381 257/211 |
| 2008/0128641 A1 | 6/2008 | Henley et al. |
| 2009/0206275 A1 | 8/2009 | Henley et al. |
| 2011/0068434 A1* | 3/2011 | Yamaguchi ........... C30B 29/406 257/615 |
| 2012/0091587 A1* | 4/2012 | Or-Bach ............. H01L 21/6835 257/741 |
| 2013/0292691 A1* | 11/2013 | Henley .................... H01L 21/78 257/76 |
| 2014/0001486 A1 | 1/2014 | Bougrov et al. |
| 2014/0197419 A1* | 7/2014 | Henley ................. C30B 29/406 257/76 |
| 2015/0084074 A1* | 3/2015 | Bayram .................. C30B 25/18 257/94 |
| 2015/0287687 A1 | 10/2015 | Farrens et al. |
| 2016/0020129 A1 | 1/2016 | Farrens et al. |
| 2016/0020360 A1 | 1/2016 | Schubert et al. |
| 2016/0087141 A1* | 3/2016 | Kumar .................. H01L 33/007 438/480 |
| 2016/0155893 A1 | 6/2016 | Schubert et al. |
| 2016/0372628 A1 | 12/2016 | Henley et al. |
| 2018/0005815 A1* | 1/2018 | Wang .................. H01L 21/0243 |

OTHER PUBLICATIONS

Yusuke Mori et al., "Growth of GaN Crystals by Na Flux Method", ECS Journal of Solid State Science and Technology, Jul. 9, 2013, vol. 2, Issue 8, The Electrochemical Society.

T. Pinnington et al., "InGaN/GaN multi-quantum well and LED growth on wafer-bonded sapphire-on-polycrystalline AlN substrates by metalorganic chemical vapor deposition", Journal of Crystal Growth, Jan. 24, 2008, pp. 2514-2519, vol. 310, Elsevier.

Vladimir Dmitriev et al., "Chapter 1 Hydride Vapor Phase Epitaxy of Group III Nitride Materials", III-Nitride Semiconductor Materials, Mar. 2006, Imperial College Press.

Dirk Ehrentraut et al., "Chapter 11 A Brief Review on the Na-Flux Method Toward Growth of Large-Size GaN Crystal", Technology of Gallium Nitride Crystal Growth, 2010, pp. 235-244, Ehrentraut, Meissner, and Bockowski, Eds.

V.P. Amarasinghe et al., "Properties of H+ Implanted 4H-SiC as Related to Exfoliation of Thin Crystalline Films", ECS Journal of Solid State Science and Technology, Jan. 18, 2014, pp. 37-42, The Electrochemical Society.

Jae-Hyung Lee et al., "Smart-Cut Layer Transfer of Single-Crystal SiC Using Spin-on-Glass", Journal of Vacuum Science & Technology B, Jul. 3, 2012, pp. 042001-1-042001-6, vol. 30, No. 4, American Vacuum Society.

J.W. Hutchinson et al., "Mixed Mode Cracking in Layered Materials", Advances in Applied Mechanics, 1992, pp. 63-187, vol. 29, Academic Press, Inc.

Motoki et al., "Preparation of 2-inch GaN Substrates", Proc. 21st Century COE Joint Workshop on Bulk Nitrides IPAP Conf. Series 4, pp. 32-37.

Xun Li et al., "Properties of GaN layers grown on N-face freestanding GaN substrates", Journal of Crystal Growth, Dec. 29, 2014, pp. 81-85, vol. 413, Elsevier B.V.

A.R.A. Zauner et al., "Homo-epitaxial growth on the N-face of GaN single crystals: the influence of the misorientation on the surface morphology", Journal of Crystal Growth, 2002, pp. 14-21, vol. 240, Elsevier Science B.V.

Paul K. Chu et al., "Plasma immersion ion implantation—a fledgling technique for semiconductor processing", Materials Science and Engineering, Jun. 24, 1996, pp. 207-280, vol. R17, Elsevier Science S.A.

\* cited by examiner

US 10,186,630 B2

SEED WAFER FOR GAN THICKENING USING GAS- OR LIQUID-PHASE EPITAXY

CROSS-REFERENCE TO RELATED APPLICATIONS

The instant nonprovisional patent application claims priority to U.S. Provisional Patent Appl. 62/370,169 filed Aug. 2, 2016, and also to U.S. Provisional Patent Appl. 62/378,126 filed Aug. 22, 2016, both of which are incorporated by reference in their entireties herein for all purposes.

BACKGROUND

Incorporated by reference in its entirety herein for all purposes, is published U.S. Patent Appl. No. 2014/0197419.

SUMMARY

Embodiments relate to fabricating a wafer including a thin, high-quality single crystal GaN seed layer serving as a template for forming additional GaN material. A bulk ingot of GaN material is subjected to implantation to form a subsurface cleave region. The implanted bulk material is bonded to a substrate having lattice and/or Coefficient of Thermal Expansion (CTE) properties compatible with GaN. Examples of such substrate materials can include but are not limited to AlN and Mullite. The GaN seed layer is transferred by a controlled cleaving process from the implanted bulk material to the substrate surface. The resulting combination of the underlying substrate and the GaN seed layer, can form a template for subsequent growth of additional overlying high quality GaN material. This growth of high-quality GaN can take place utilizing techniques such as Liquid Phase Epitaxy (LPE) or vapor phase epitaxy, e.g., Metallo-Organic Chemical Vapor Deposition (MOCVD) or Hydride Vapor Phase Epitaxy (HVPE). The substrate bearing the seed layer and the additional GaN grown thereon, may be incorporated into an electro-optical device such as a high-brightness light emitting diode.

DETAILED DESCRIPTION

Semiconducting materials find many uses, for example in the formation of logic devices, solar cells, and increasingly, illumination. One type of semiconductor device that can be used for illumination is the high-brightness light emitting diode (HB-LED). In contrast with traditional incandescent or even fluorescent lighting technology, HB-LED's offer significant advantages in terms of reduced power consumption and reliability.

An optoelectronic device such as a HB-LED may rely upon materials exhibiting semiconductor properties, including but limited to type III/V materials such as gallium nitride (GaN) that is available in various degrees of crystalline order. However, these materials are often difficult to manufacture.

Figure 1A:
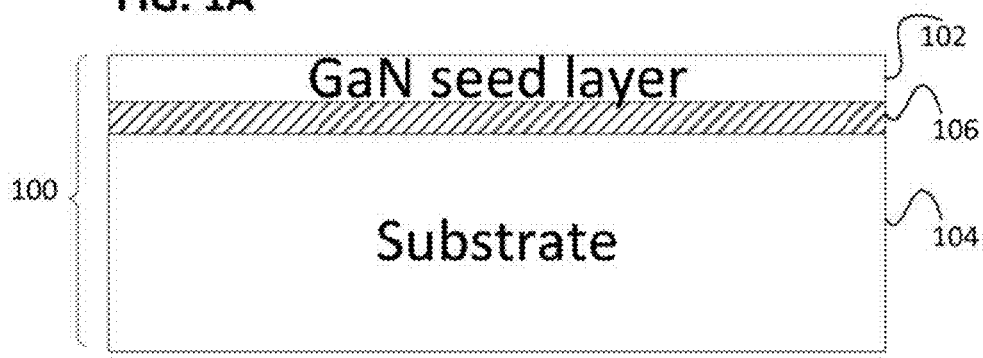
FIG. 1A shows a simplified view of a seed wafer which may be prepared according to an embodiment.
Figure 1B:
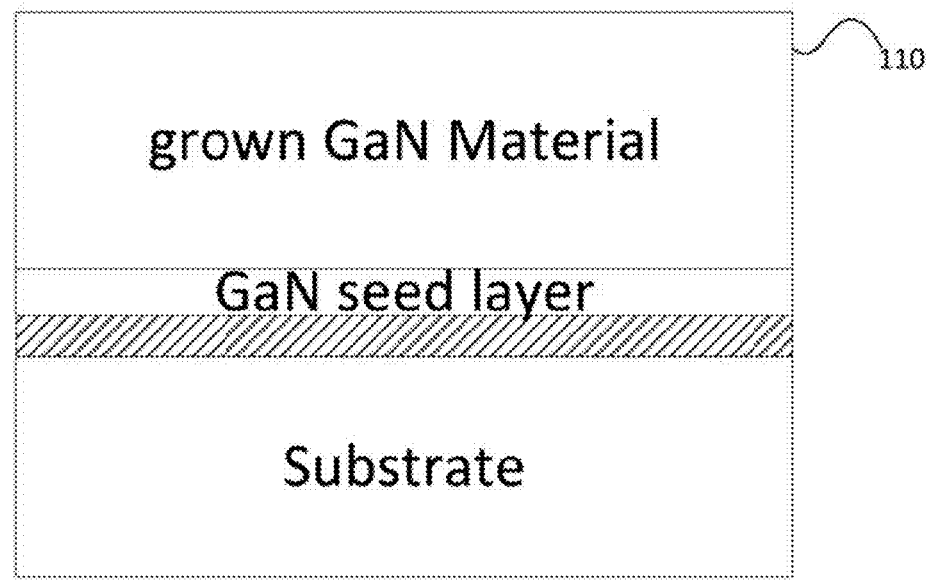
FIG. 1B shows further processing of the seed wafer of FIG. 1A to create an optoelectronic device.

One fabrication approach is illustrated in FIGS. 1A-B. There, a seed workpiece 100 is provided. This template blank comprises a thin, high quality seed layer 102 of GaN overlying a substrate 104 and separated therefrom by a dielectric layer 106, which typically comprises an oxide.

According to certain embodiments the substrate material may be selected to have Coefficient of Thermal Expansion (CTE) properties that are compatible with GaN material.

Particular examples of possible candidates for substrate materials include AlN, Mullite, Molybdenum and Tungsten. An example table is given below.

| MATERIAL | CTE |
|---|---|
| GaN | $5.5 \times 10^{-6}$ $K^{-1}$ |
| AlN | $5.2 \times 10^{-6}$ $K^{-1}$ |
| Mullite ($3Al_2O_3 \cdot 2SiO_2$) | $5.4 \times 10^{-6}$ $K^{-1}$ |
| Molybdenum | $5.0 \times 10^{-6}$ $K^{-1}$ |
| Tungsten | $4.5 \times 10^{-6}$ $K^{-1}$ |

If the material can meet thermal, chemical and mechanical requirements, the substrate can comprise glass, quartz, metal or metal alloy, or other composites, and the like. In other embodiments, the substrate can comprise any homogeneous, graded, or multilayered material, or any combination of these. That is, the substrate can be made of almost any monocrystalline, polycrystalline, or even amorphous type substrate. Using engineered alloys, the base material can be adjusted to better match the GaN expansion coefficient. For example, a Molybdenum-Copper (Mo:Cu) alloy can be adjusted to better match bulk GaN.

As shown in FIG. 1B, processing the exposed surface of the GaN seed layer of the seed template may allow for the formation of additional thickness 110 of high quality GaN material. That additional thickness of GaN material (with or without the accompanying substrate and/or dielectric material) may ultimately be incorporated into a larger optoelectronic device structure (such as a HB-LED).

Typically, a thickness on the order of a few hundred microns to a few centimeters may be grown over the seed layer by the epitaxial process. According to various embodiments, the additional GaN material may be grown to a significantly greater thickness than the underlying seed layer. For example, GaN growth thickness of a few millimeters to a few centimeters would allow wafering operations such as grinding, polishing and multi-wire wafer sawing to singulate the GaN material typically into separate free-standing substrates of 200-500 um in thickness. According to certain embodiments, the seed layer has a thickness of between about 100-5000 nm, and the additional GaN has a thickness of between about 0.01-10 cm. In some embodiments the seed layer has a thickness of between about 0.5-2 um, and the additional GaN has a thickness of between about 0.5-2 cm. In particular embodiments the seed layer has a thickness of between about 0.5-1 um, and the additional GaN has a thickness of between about 0.5-1 cm.

One approach for growing the additional high-quality GaN material upon the workpiece bearing the seed layer, is through Liquid Phase Epitaxy (LPE). Such LPE involves the growth of solid, single crystal GaN from a liquid solution. LPE may take place under different conditions such as temperature, pressure, solute, solvent, and concentration. Examples are described by Mori et al, "Growth of GaN Crystals by Na Flux Method", *ECS Journal of Solid State Science and Technology*, vol. 2, issue 8 (2013), and by Ehrentraut and Meissner, "Chapter 11 A Brief Review on the Na-Flux Method Toward Growth of Large-Size GaN Crystal", from *Technology of Gallium Nitride Crystal Growth*, Ehrentraut, Meissner, and Bockowski, Eds. (2010), both of which are incorporated by reference in their entireties herein for all purposes.

LPE performed utilizing dilute solutions may offer certain benefits. One is to permit the application of lower growth rates for improved thickness control. Another may be to apply lower growth temperatures for improved structural perfection and stoichiometry and to reduce the detrimental effects of thermal expansion differences of substrate and epilayer. A third benefit of dilute LPE may be to reduce the risk of unwanted spontaneously nucleated crystallites.

LPE may offer certain benefits as compared to vapor phase techniques. In particular, from a thermodynamics perspective there is a significantly smaller difference in Gibbs free energy between reactants in the liquid phase and products in the solid phase, as compared to reactants in the vapor phase and products in the solid phase. Due to the near-equilibrium conditions occurring during layer deposition using LPE, the structural perfection of the layers may be superior and quasi-atomically flat surfaces and interfaces may be achieved. Also, generally excellent stoichiometry of the layers can be obtained.

Of course, embodiments are not limited to use of seed workpieces in connection with LPE, and vapor phase epitaxy can also be employed to thicken the GaN material from the initial seed layer. One example of vapor phase epitaxy is Metallo-Organic Chemical Vapor Deposition (MOCVD). Another example of vapor phase epitaxy is Hydride Vapor Phase Epitaxy (HVPE). Examples of HVPE approaches are described by Vladimir Dmitriev and Alexander Usikov, in "Chapter 1 Hydride Vapor Phase Epitaxy of Group III Nitride Materials", from *III-Nitride Semiconductor Materials*, Imperial College Press., and by Motoki et al., "Preparation of 2-inch GaN Substrates", *Proc. 21st Century COE Joint Workshop on Bulk Nitrides IPAP Conf. Series* 4 pp. 32-37, both of which are incorporated by reference in their entireties herein for all purposes.

Figure 1C:
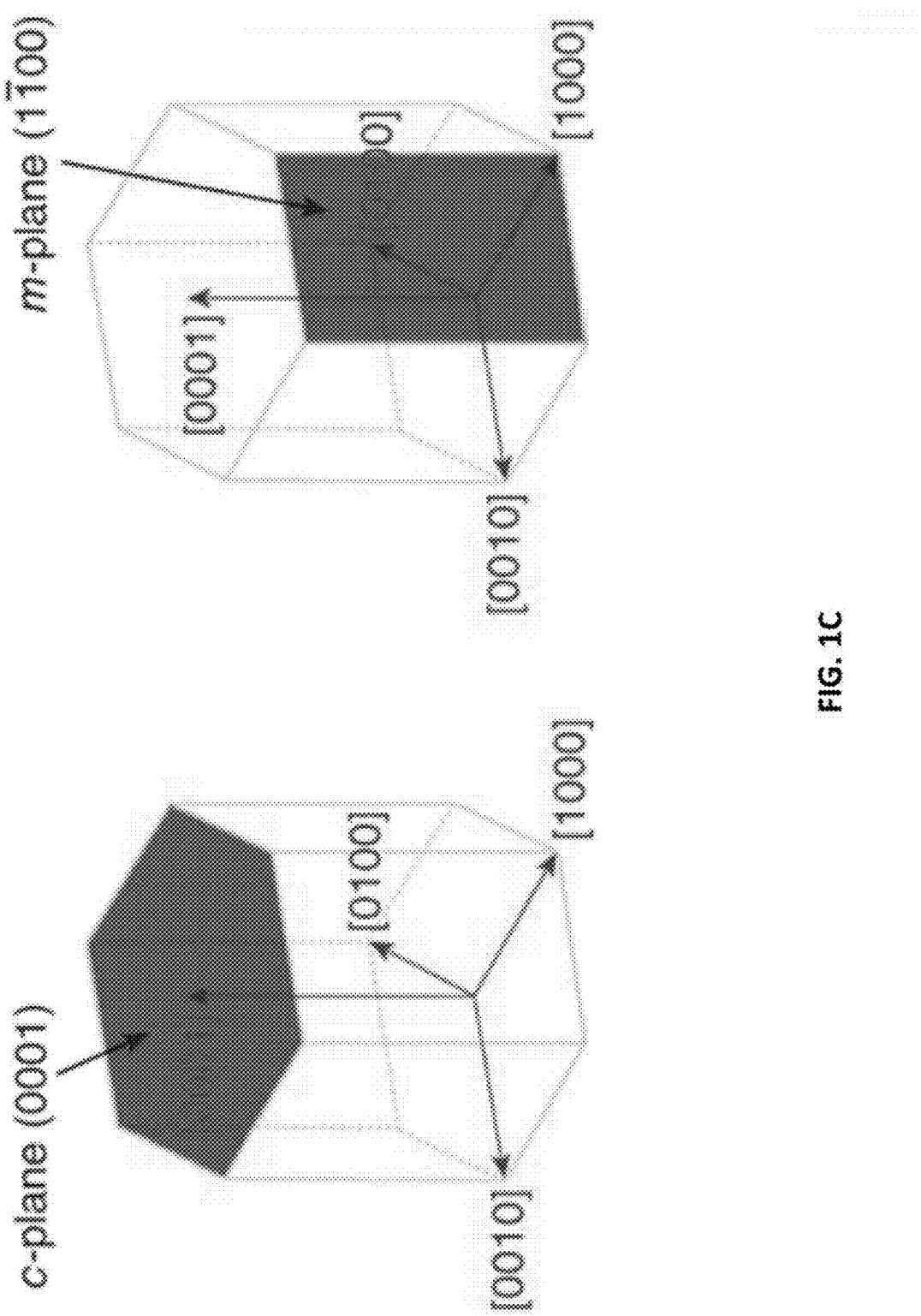
FIG. 1C shows polar and non-polar forms of GaN.

Various types of GaN may be employed as the seed layer. For example, wurtzite GaN-based materials exists in both polar and non-polar forms. FIG. 1C shows non-polar GaN exhibiting an m-plane (1100). GaN in its non-polar form is relatively expensive.

Figure 1D:
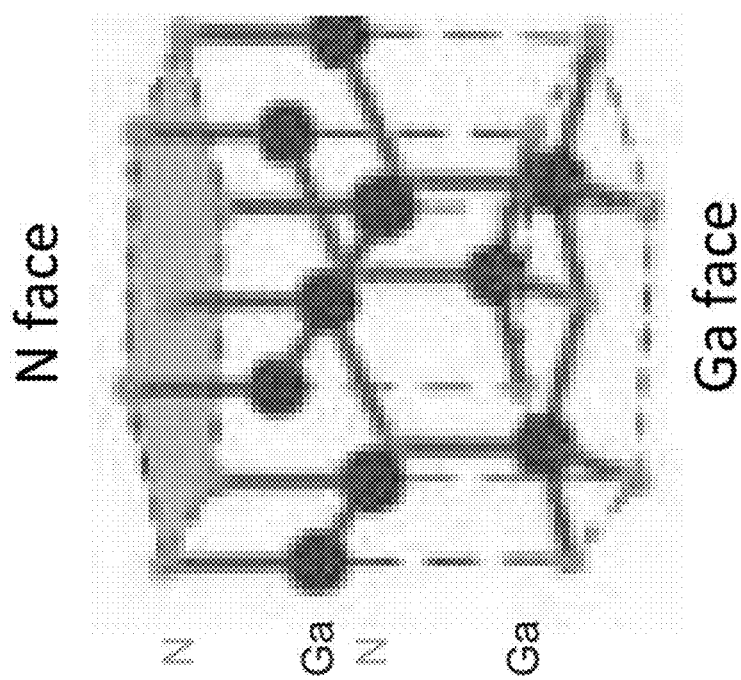
FIG. 1D shows Ga and N faces of polar GaN.

As also shown in FIG. 1C, polar GaN exhibits a c-plane (0001). FIG. 1D shows that polar GaN is characterized by having an N face and a Ga face.

Certain embodiments may feature the N face of the polar GaN seed layer bonded to the dielectric, with the Ga face of the GaN seed layer exposed for further processing (e.g., thickening by epitaxial techniques). This is because the Ga face has traditionally proven more amenable to the growth of high quality GaN than the N face.

It is emphasized, however, that other embodiments are possible. For example some applications (e.g., power electronics) may call for growth of GaN material from the N face, rather than from the Ga face. Incorporated by reference herein for all purposes are the following articles: Xun Li et al., "Properties of GaN layers grown on N-face free-standing GaN substrates", Journal of Crystal Growth 413, 81-85 (2015); A. R. A. Zauner et al., "Homo-epitaxial growth on the N-face of GaN single crystals: the influence of the misorientation on the surface morphology", Journal of Crystal Growth 240, 14-21 (2002). Accordingly, template blank structures of alternative embodiments could feature a GaN layer having an N face that is exposed, rather than a Ga face.

Described now in detail, are layer transfer processes which may be useful for example in fabricating a GaN-containing template blank structure such as is shown in FIG. 1A. Specifically, particular embodiments transfer thin layers of material utilized in electronic devices (e.g., GaN for optoelectronic devices), from a donor bulk material to the substrate.

Figure 2A:
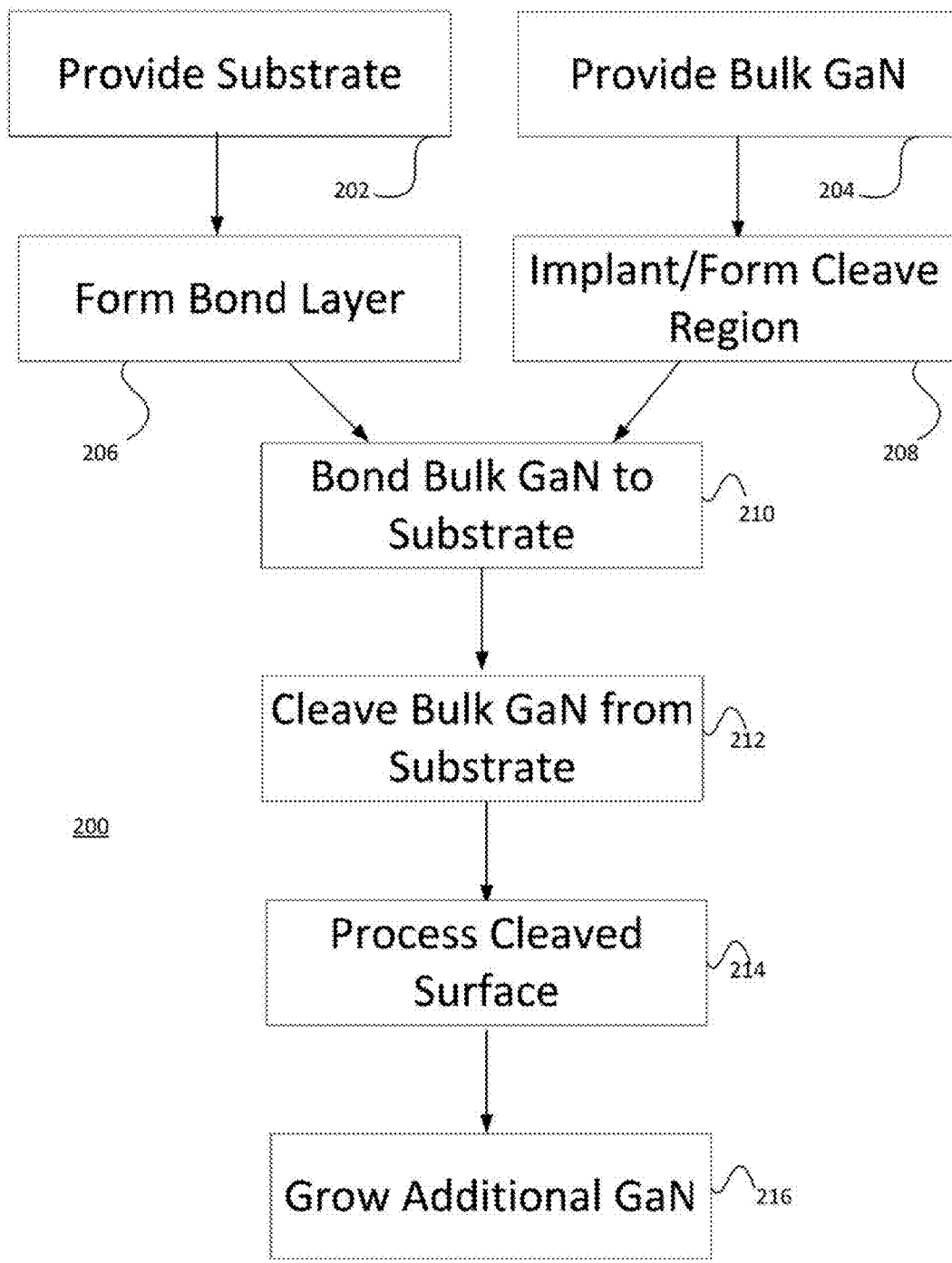
FIG. 2A shows a simplified flow diagram of a process according to an embodiment.
Figure 2B:
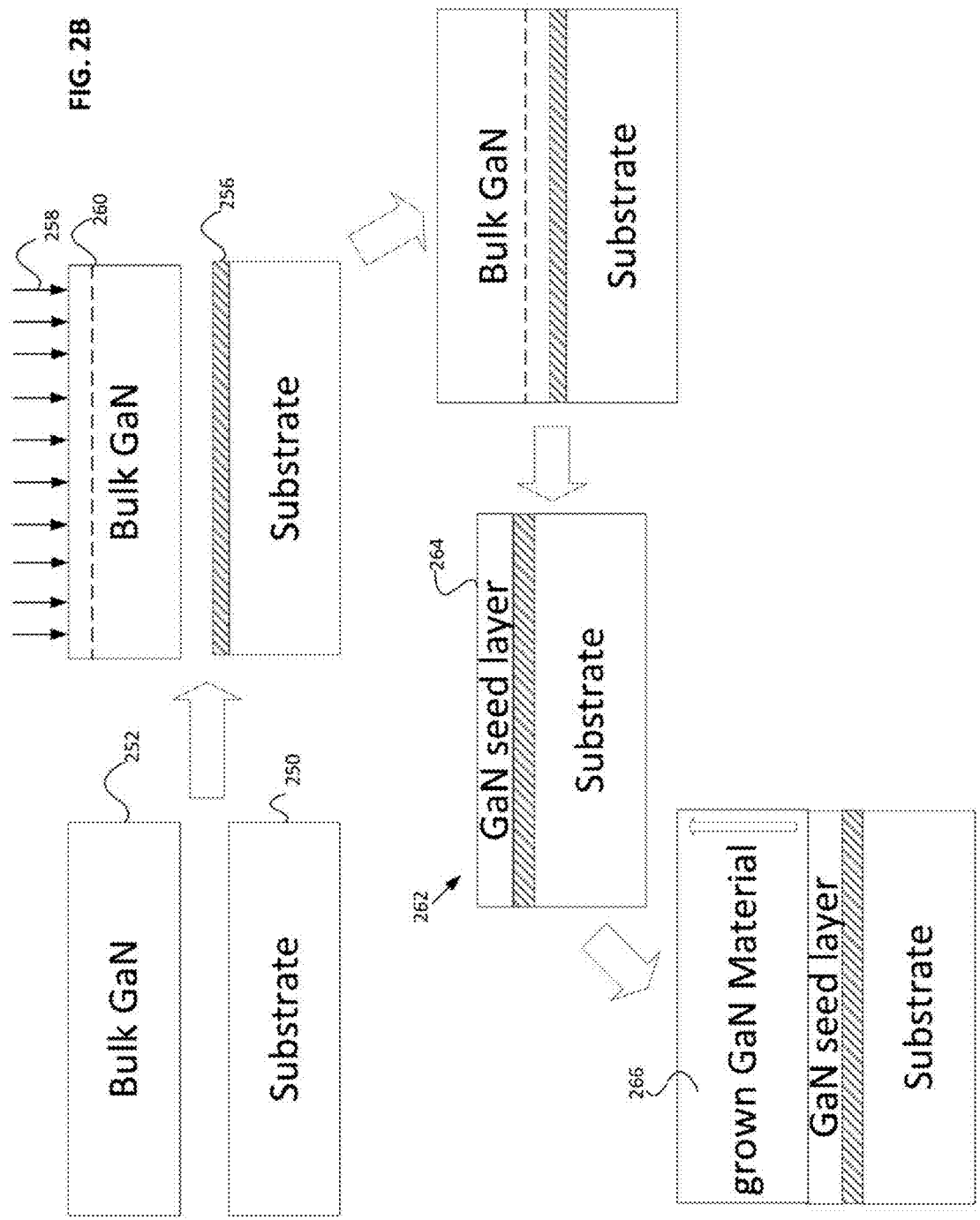
FIG. 2B shows a simplified view of a process of GaN growth according to an embodiment.

FIG. 2A is shows a simplified flow of a process according to an embodiment. FIG. 2B shows an overview of the exemplary process 200 according to an embodiment.

In a first step 202, a substrate 250 is provided. As described above, that substrate may have lattice and/or CTE properties compatible with the form of GaN that is to be used. Possible candidate substrate materials comprise AlN and Mullite.

In a second step 204, bulk GaN 252 is provided. The bulk GaN may be a crystal of polar or non-polar GaN. In a particular embodiment the bulk GaN (and/or the substrate) may be 2" wafers, but they are not limited to being of any specific size or dimension.

In a third step 206, the substrate is prepared to receive the GaN. This may involve the formation of an oxide bond layer 256. Although not shown, the surface of the bulk GaN 252 to be bonded may also be treated to have a bond layer added or processed to be more compatible with the bond step 210.

In particular embodiments, this bond layer can be formed by exposure to oxidizing conditions. In some embodiments this bond layer may be formed by the addition of oxide, e.g., as spin-on-glass (SOG), or other spin on material (e.g., XR-1541 hydrogen silsesquioxane electron beam spin-on resist available from Dow Corning), and/or $SiO_2$ formed by Plasma Enhanced Chemical Vapor Deposition (PECVD) or oxide sputtering techniques.

In a fourth step 208, the bulk GaN is subject to implantation of particles 258 (e.g., hydrogen ions) to form a subsurface cleave region 260. In some embodiments this cleave region may lie at a depth of between about 10-20 um underneath the surface of the bulk material. In other embodiments the cleave region may lie at a depth of between 0.05-2 um underneath the surface of the bulk material.

Forming a cleave region may depend upon factors such as the target material, the crystal orientation of the target material, the nature of the implanted particle(s), the dose, energy, and temperature of implantation, and the direction of implantation. Such implantation may share one or more characteristics described in detail in connection with the following patent applications, all of which are incorporated by reference in their entireties herein: U.S. patent application Ser. No. 12/789,361; U.S. patent application Ser. No. 12/730,113; U.S. patent application Ser. No. 11/935,197; U.S. patent application Ser. No. 11/936,582; U.S. patent application Ser. No. 12/019,886; U.S. patent application Ser. No. 12/244,687; U.S. patent application Ser. No. 11/685,686; U.S. patent application Ser. No. 11/784,524; U.S. patent application Ser. No. 11/852,088.

In certain embodiments the thickness of material of the implanted surface of the donor is cleaved from the bulk material using the cleave region formed by using relatively high H+ proton implant energies in the MeV range. This produces a detached layer of semiconductor material having a thickness of between about 10-20 um. In other embodiments using bonded layer-transfer, thinner cleaved layers of 0.05-1 um may be used. For producing GaN cleaved films of these thicknesses, lower H+ proton implant energies ranging from approximately 5-180 keV may be used. For example, 40 keV H+ proton energy would produce a GaN cleaved film of approximately 0.25 um in thickness. It is understood that $H_2+$ can also be utilized for this implant step. In such cases, the dose rate would be doubled while the effective H+ energy would be halved. For example, a 80 keV $H_2+$ implant could have the same detached layer thickness (range) than a 40 keV H+ implant. However, the dose rate would be double the H+ dose rate for the same implant current.

In step 210, bonding is performed by placing the oxide-bearing surface of the substrate in contact with the implanted face of the bulk GaN, followed by heating. Other acts may be performed at this time, such as touch polishing, plasma treatment and cleaning prior to bonding.

Step 212 shows the subsequent controlled cleaving process to release the bulk GaN from the substrate. Specifically, the application of energy results in cleaving along the cleave plane in the donor bulk GaN material. This cleaving produces the desired GaN seed template blank 262 bearing the cleaved thin GaN seed layer 264.

The cleaving may take place utilizing the application of various forms of energy, and may exhibit one or more of the characteristics disclosed in any of the patent applications incorporated by reference above. In a particular embodiment, this cleaving may take place utilizing a compressional force applied in the form of a static gas in a high pressure chamber containing the implanted bulk material. The application of energy in various forms to accomplish cleaving according to particular embodiments is also described in the U.S. Pat. No. 6,013,563 incorporated by reference herein for all purposes.

As described in further detail below, a cleaving process may itself comprise one or more steps. For example, cleaving may comprise initiation performed under certain conditions, followed by propagation performed under different conditions.

Returning to FIG. 2A, step 214 involves further steps, such as treatment of the surface of the seed GaN layer. Such treatment may reduce roughness in the exposed surface, making it more amenable to addition of high quality GaN as discussed earlier in connection with FIG. 1B. Surface treatment can involve thermal, chemical, and/or plasma treatments.

In step 216, FIG. 2A further shows the growth of additional GaN 266 over the GaN seed layer. As mentioned previously, this GaN growth can comprises liquid phase epitaxial growth and/or vapor phase epitaxial growth.

The above sequence of steps provide a method according to certain embodiments of the present invention. Other alternatives can also be provided where steps may be added, one or more steps may be removed, or one or more steps may be provided in a different sequence. For example in an alternative embodiment, the bulk GaN could itself include a bonding material, with particle implantation taking place before or after formation of that bonding material.

It is further noted that various embodiments could involve the use of bond-and-release systems, in which the GaN seed layer and substrate are later separated from each other. Additional description of such bond and release approaches are described in U.S. patent application Ser. No. 15/186,185, filed Jun. 17, 2016, now published as U.S. Patent Publication No. 2016/0372628 and incorporated by reference herein for all purposes.

Methods according to embodiments of the invention can be used in a variety of applications. Examples include but are not limited to optoelectronic devices, semiconductor device packaging, photovoltaic cells, MEMS devices, and others.

According to certain embodiments, a free standing film may be separated from a bulk material. In one embodiment, a free standing layer of semiconductor material such as single crystal GaN, having a thickness of 10 μm or greater, may be cleaved from a bulk ingot utilizing high energy implantation. Cleaving the ingot in this manner substantially reduces the amount of semiconductor material that is otherwise lost to the kerf in a conventional blade cutting process. In addition to enhancing the efficiency of the cleave action, managing parameters such as ion dose and temperature profile is also important to limit and control the radiation damage to the material that is separated. The resulting cleaved free standing film may be particularly suited for use in illumination, for example LEDs or laser devices.

For purposes of this disclosure, a "free standing film" or "free standing layer" is defined as a film of material that can maintain its structural integrity (i.e. not crumble or break apart), without being in contact with a supporting member such as a handle or transfer substrate. Typically, very thin films (for example GaN films thinner than about 5-10 μm) are unable to be handled without breaking. Conventionally, such thin films are manipulated using a supporting structure, which may also be needed to create the thin film in the first place. Handling of thicker films (i.e. GaN films having a thickness of between 10-50 μm) may be facilitated by the use of a support, but such a support is not mandatory. Accordingly embodiments of the present invention relate the fabrication of free standing films having a thickness of greater than 10 μm. Also for purposes of the following disclosure, the terms "substrate" and "tile" are employed interchangeably.

Embodiments in accordance with the present invention are not limited to forming free standing films. Alternative embodiments may involve the formation of films supported by a substrate. Moreover, irrespective of whether the films used in various applications are truly free-standing or supported with handling or transfer substrates during processing, processed devices are usually mounted onto a mechanical interface such as a metal base for the final application as an integral part of a lighting module.

Also for purposes of the following disclosure, "bulk material" refers to a material present in bulk form. Examples of such bulk material include a substantially circular ingot or boule of single crystal GaN as grown, or a grown single crystal GaN ingot having sides shaved to exhibit other than a substantially circular cross-sectional profile. Still other examples of bulk materials are described herein.

In a specific embodiment, the present method may be applied successively to transfer multiple layers from a single ingot, e.g., GaN boule or a thickness of GaN mounted onto a suitable substrate such as a metal base substrate. That is, the method can be repeated to successively cleave slices (similar to cutting slices of bread from a baked loaf) according to a specific embodiment. Of course, there can be other variations, modifications, and alternatives.

As mentioned previously, various surface treatment processes may be employed at one or more stages. According to certain embodiments, the exposed surface of material grown from a substrate is polished to reduce roughness resulting from any cleaving process. The combination of the polished cleaved material and the underlying substrate may then be transferred as an added value material for further processing and incorporation into an optoelectronic device.

While the above description references surface treatment utilizing polishing, this is not required in all embodiments, and alternatives could employ polishing in combination with other surface treatment, or even surface treatment that does not involve polishing. For example, according to some embodiments the surface treatment could include an anneal. In particular embodiments the anneal could take place in the presence of an overlying cap layer, for example comprising AlN or SiO2. The annealing could be performed in a furnace (e.g. typically where the cap layer is present), or could be performed within a MOCVD chamber (e.g. where no cap layer is present).

Surface treatment (e.g. comprising polishing, annealing, and/or cap layer formation) could also include etching processes. Examples of etching processes can include but are not limited to plasma etching, and/or chemical etching. Chemical assisted ion beam etching (CAIBE) is one example of a type of chemical etching. Wet chemical etching is another example of chemical etching.

The above sequence of steps provide a method according to certain embodiments of the present invention. Other alternatives can also be provided where steps may be added, one or more steps may be removed, or one or more steps may be provided in a different sequence. For example in an alternative embodiment, substrate bonding could take place after the cleaving, with the cleaving resulting in a free standing film in turn bonded to the substrate.

No specific crystal orientation is required of the donor bulk GaN material. Thus a donor comprising a GaN ingot may exhibit one of the typical crystalline orientations, for example (0001).

As mentioned above, materials utilized during a layer transfer process may be specifically selected according to their properties, including their thermal properties. Thus substrates and/or layers may comprise material(s) having a coefficient of thermal expansion (CTE) compatible with conditions expected to be encountered during the process. For example, the linear coefficient of thermal expansion of GaN ($\alpha_{GaN}$) is about $5.5 \times 10^{-6}$ K$^{-1}$.

Examples of such materials having CTE compatibility with GaN may include certain glasses. Other examples of materials having CTE compatibility with GaN can include but are not limited to, metal or metal alloys. Possible suitable metals may include Molybdenum or Tungsten, while candidate metal alloys may comprise molybdenum, such as copper molybdenum alloys or molybdenum tungsten alloys.

Embodiments are not specifically limited to particular materials mentioned so far. Examples of various layers which may be used can include barrier layers, thermocompression bond layers, a mirror layer, and the GaN buffer and device growth layers. Barrier layers are layers that protect the integrated films from contamination, inter-mixing and other deleterious effects during thermal processing such as the GaN device layer formation step(s). Such layers can include AlN, HfN, TiB2, Pt, Ta among other well known barrier layer materials. Other such layers serving as encapsulation layers may also be desirable to enhance surface properties such as porosity and roughness. For example, a nickel layer (polished or not depending on the specific application) may serve as an encapsulating layer on a Molybdenum alloy substrate to provide good bond yield and uniform surface characteristics. Other coating layers can include but are not limited to nickel-gold alloys, ruthenium, chromium or silver.

Subsequent steps to grow the devices from the GaN layer (e.g., in FIG. 1B) may involve metal-organic chemical vapor deposition (MOCVD) of GaN at roughly 1000° C. for 2-3 hours. Accordingly, the use of appropriate buffer and/or barrier layers may ensure thermal survivability of desired features.

Together, the layers form an engineered GaN growth substrate, and may achieve one or more of the following possible features and potential benefits for the HB-LED device manufacturers.

One possible benefit is a reduction in lattice mismatch. In particular, this benefit may be achieved by using a thin, high-quality GaN layer for epitaxial growth.

Another possible benefit is a low incidence of threading dislocation density (TDD)/Defects. According to embodiments, these defects may be reduced to at or below Free Standing GaN levels, using a thin, high-quality GaN layer.

Still another possible benefit is a reduction in CTE-Mismatch. Use of a CTE-matched substrate engineered to match the GaN layer through the epitaxial growth temperature, may thereby eliminate CTE mismatch induced layer stresses, cracks and defects.

Yet another possible benefit is the realization of high electrical and thermal conductivity. The use of a metal substrate and thermally and electrically conductive internal layers, may allow the growth substrate to be used as the mounting substrate for the HB-LED package/luminaire in the final vertical LED structure. High thermal and electrical conductivity allows higher External Quantum Efficiency (EQE), higher Wall Plug Efficiency (WPE), and may eliminate certain back-end manufacturing steps. Proposed embodiments may allow vertical LED contact structure with desired thermal conductivity of the multi-stack substrate exceeding 5-30 W/cm$^2$-K, and electrical resistance of the multi-stack substrate (related to the electrical conductivity) may be less than $1 \times 10^{-4}$ Ohm-cm$^2$.

Embodiments may offer a possible benefit of enhanced optical efficiency. In particular, the integration of an internal reflector under the GaN growth film, may allow the use of the substrate within the final HB-LED package, with further savings in back-end manufacturing steps such as mirror layer growth and lift-off/bond steps. A reflection layer can comprise a metal such as silver, gold, aluminum. Use of a thin silver layer, for example, could support a reflectivity exceeding 75% in the 400-500 nm spectral range, which may be a desirable feature to achieve high external quantum efficiency.

The reflection layer can comprise a dielectric layer stack. Such a dielectric layer stack may be made electrical conductive, in a manner that balances conductivity with reflective properties. Examples of parameters which can be controlled to form a dielectric layer stack exhibiting the desired properties can include but are not limited to, a number of layers in the stack, a thickness of layers in the stack, specific materials included in the stack, and/or the presence of dopant(s).

Still another possible benefit is the ability to use a smaller device size. Embodiments may offer a low droop and thus efficient devices can be operated at higher current density. With up to 10× or even more devices able to be made on a substrate, epitaxial and packaging costs can be substantially lowered.

Embodiments may also be employed for GaN-based electronic devices. In such embodiments, the layers can be modified with a thermally conductive, electrically insulating intervening layer below the GaN device layer. In a particular embodiment, the integrated mirror layer of an LED embodiment could be substituted with a thin (e.g. 20-50 um) insulating layer that would allow good GaN electronic device operation but also allow good thermal heat transfer. Such an intervening layer can be a material having good thermal conductivity and high electrical resistivity. Depending on the desired performance and cost targets, materials such as AlN (Aluminum Nitride) and Sapphire can be suitable.

One key application of the layer-transfer technology, may be to fabricate a functionally equivalent substrate to a free-standing GaN wafer for HB-LED and laser diode device manufacturing. Possible commercial advantages achieved in using free-standing GaN may include but are not limited to (i) better HB-LED performance (up to 100% higher in lumens/watt) and (ii) lower cost of epitaxial device layer manufacturing due to 30-50% less epitaxial growth chamber time by the elimination of graded buffers. In addition, the more efficient device offers substantial savings in packaging as well as competitive differentiation.

The use of conventional free-standing GaN substrates in device manufacturing is currently limited by cost and size limitation (e.g. 2" and 4" diameters presently). Both of these limitations are considered fundamental and strongly linked to the present methods of manufacturing GaN crystals by hydride vapor phase epitaxy (HVPE) or ammonothermal (Ga or GaN in supercritical ammonia/mineralizer) growth approaches.

HVPE and ammonothermal growth methods are slow and costly. Higher quality GaN usually necessitates less than 100-200 microns per hour using HVPE Ammonothermal growth may be slower, but with somewhat better crystal quality.

As the GaN bulk crystal is grown conventionally, defects such as dislocations generally work themselves out of the crystal by edge termination. This strongly ties the crystal diameter to the rate of dislocation reduction, and hence the HVPE and ammonothermal growth methods are generally limited to small crystal diameters for making high-quality GaN. Defect levels achievable on commercially available bulk or free-standing GaN (FS-GaN) 2" substrates are about $10^4$-$10^6$ defects/cm².

Because of the slow growth rate and use of wiresaws to fabricate these substrates, FS-GaN prices are currently in the $1,000-$2,000 (2" wafer) and $3,000-$5,000 (4" wafer). Because of the high cost of these substrates, their use is limited to R&D (High-Electron Mobility Transistor (HEMT) and optoelectronic as well as blue/UV laser diode manufacturing.

Although HB-LED device performance has been shown to improve as much as 100% using these higher quality substrates by eliminating the "droop effect", their high cost and limitation to small wafer diameters has prohibited their use. The use of high-quality GaN as a growth medium reduces or eliminates device "droop" (brightness efficiency drops with increasing current), a parasitic device characteristic that increases device area to achieve higher lumens/W efficiency and control areal power dissipation. The tailing off or droop of the emission power limits efficiency to about 100-120 lumens/watt for sapphire substrate-based devices but FS-GaN substrate HB-LED devices have been shown to yield over 200 lumens/watt.

This low-droop translates to an ability to increase the current density that in turn will lead to as much as a 10× reduction in the size of HB-LED devices fabricated on substrates utilizing high-quality GaN material according to embodiments.

Thus as indicated above, embodiments may benefit the HB-LED industry in numerous areas, including but not limited to cost, packaging, and reliability.

It is noted that certain embodiments previously described (e.g., in connection with FIG. 2B) utilize implantation of particles to form a cleave region at a depth into the workpiece. In some embodiments, accelerated particles could be directed in a manner (e.g. energy) calculated to form a cleave region at or near an interface between additional material and an underlying workpiece. The presence of the implanted particles in a region at or near this interface, could ultimately reduce an amount of applied energy required to initiate and/or propagate cleaving in a cleave region located proximate to the interface.

And while the above description has focused upon forming an additional material on a workpiece comprising a single crystal seed GaN layer to form a multi-layer structure, this is also not required. According to alternative embodiments, the additional material could be present on a workpiece. One example of such additional material is single-crystal SiC, (111) silicon, single-crystal and metal films where the material can serve as a seed layer for GaN heteroepitaxial growth.

Figure 3A:
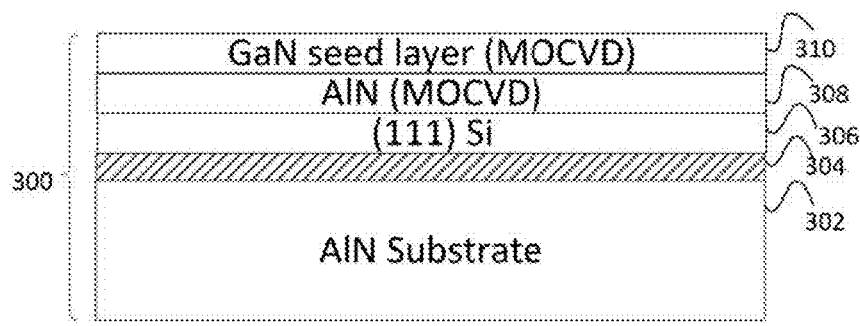
FIGS. 3A-C show a simplified view of a process according to an embodiment.

Specifically, FIG. 3A shows a simplified view of an embodiment of a template workpiece featuring (111) single crystal silicon. Relative thicknesses of the various layers shown in FIG. 3A are not drawn to scale.

The template workpiece 300 of FIG. 3A comprises a polycrystalline AlN substrate 302 bearing an oxide bonding layer 304. That oxide bonding layer may have a thickness, for example, of between about 200-400 nm.

Attached to the oxide bonding layer 304 is a single crystal silicon layer 306. This single crystal silicon layer has a (111) crystal plane orientation, which may have an intentional off-cut angle of between about 0.1-0.5°.

The single crystal silicon layer may have a thickness of between about 100-200 nm. It may be formed on the template substrate by separation from a high quality ingot utilizing a layer transfer process, for example in certain embodiments a controlled cleaving process as is described herein.

In one possible embodiment, a thin layer of AlN 308 is in turn formed over the single crystal silicon layer. This AlN layer is formed by MOCVD to a thickness of between about 100-200 nm. Capping the silicon, it serves as a precursor layer to the GaN seed layer that is to be grown. Other low-temperature nucleation layer compositions that serve to promote high-quality GaN growth can also be utilized. Incorporated by reference herein for all purposes, is Pinnington et al., "InGaN/GaN multi-quantum well and LED growth on wafer-bonded sapphire-on-polycrystalline AlN substrates by metalorganic chemical vapor deposition", *Journal of Crystal Growth* 310 (2008) 2514-2519.

In particular, FIG. 3A further shows a GaN seed layer 310 overlying the AlN capping layer. That GaN seed layer is grown at high quality overlying the AlN layer 308, also utilizing MOCVD techniques.

The surface of the high quality GaN layer offered by the workpiece, in turn serves as a template for the growth of additional GaN material to achieve substantial thicknesses. This is shown in FIG. 3B, where further high quality GaN material 312 is grown to greater thickness over the GaN seed layer utilizing techniques such as LPE and/or HVPE.

In certain embodiments, additional high quality GaN material grown by LPE would be expected to have a defect density of ~$1\times10^6$-$5\times10^7$ cm$^{-2}$. According to some embodiments, additional high quality GaN material grown by HVPE would be expected to have a defect density of ~1×10⁶-1×10⁷ cm⁻².

Figure 3B:
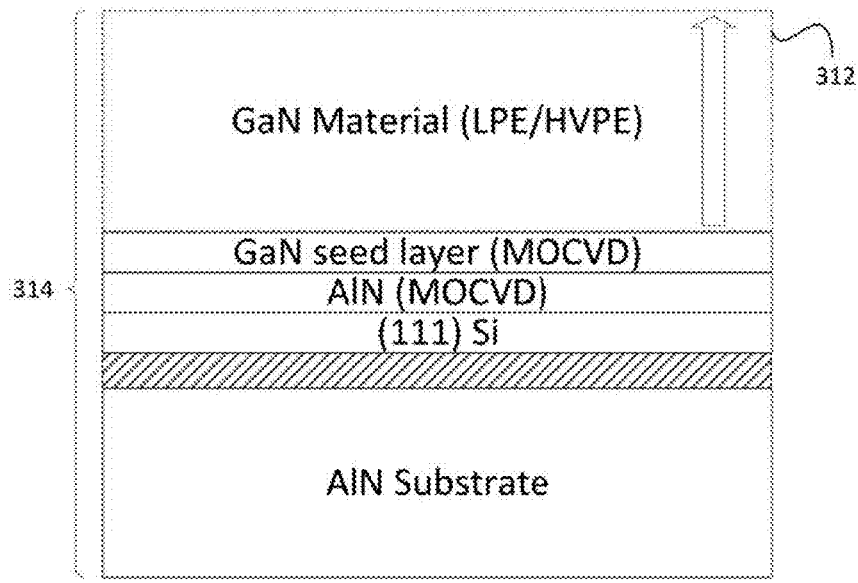
Figure 3C:
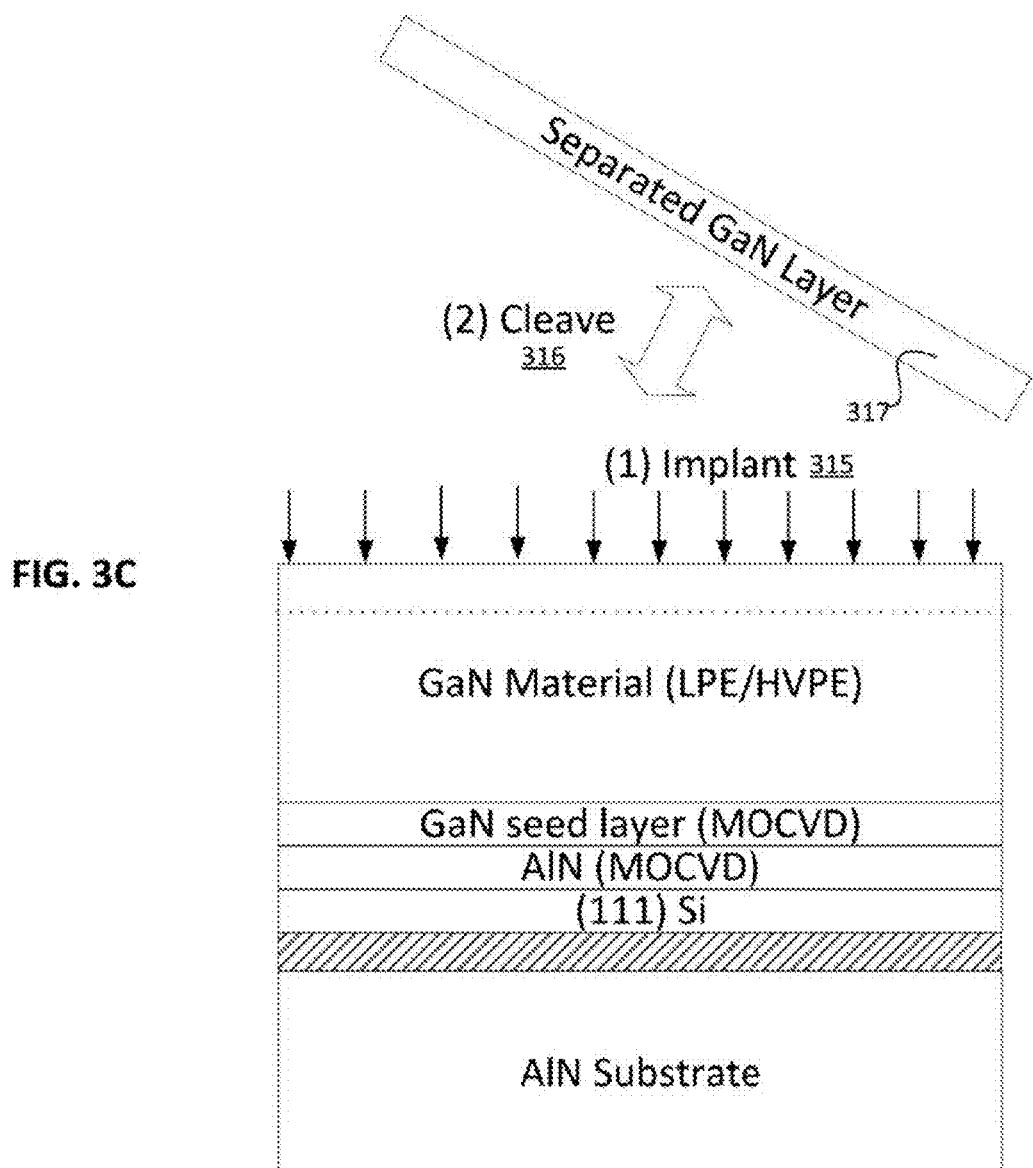

The multi-layer workpiece 314 of FIG. 3B, can in turn serve as a donor for separation of high quality GaN layers to be incorporated into electronic devices (such as HB-LEDs and power electronic devices). As shown in FIG. 3C, this may be accomplished by successive implant 315 and controlled cleaving 316 to produce separated GaN layer 317.

In some embodiments that separated GaN layer may be free standing. In other embodiments that separated GaN layer may be bonded to a temporary handle substrate or permanent target substrate.

It is noted that (111) single crystal silicon on polycrystalline AlN offers a good match in CTE with the overlying grown GaN. Referring to Table 1, the CTE match, dominated by the polycrystalline AlN base substrate would be about 0.2 ppm/C. This would allow a few hundred microns of additional GaN to be grown without cracking. The single crystal silicon also offers workable lattice matching (~17%) with the overlying grown GaN.

The general method to calculate the critical thickness $h_c$ of GaN grown on a base substrate with a net differential CTE mismatch utilizes critical energy release rate to delaminate thin-films by buckling. Such methods are explained by Hutchinson and Suo in "Mixed Mode Cracking in Layered Materials", *Advances in Applied Mechanics*, Vol. 29, pp. 63-187 (1992), which is incorporated by reference in its entirety herein for all purposes.

Using the thermal mismatch generated film stress as the driving energy ($\sigma = E \, \Delta\alpha \, \Delta T$, where E=Young's Modulus, $\Delta\alpha$=CTE mismatch and $\Delta T$=temperature differential), the equation linking this driving energy to the critical thickness characterizing the onset of film cracking/delamination is:

$$G = 0.5(1-\upsilon^2)\sigma^2 h/E \quad (1)$$

Where G is the energy release rate, $\sigma$ is the thermal mismatch generated film stress, h is the film thickness and E is Young's modulus.

At the onset of buckling, the energy release rate will equal or exceed the critical energy release rate for the GaN film. This critical energy $G_c$ is about 2 J/m². Equation (1) can be rewritten for this condition to solve for the critical thickness $h_c$ as:

$$h_c = 2EG_c/((1-\upsilon^2)\sigma^2) \quad (2)$$

Using E=300 GPa for GaN, $\upsilon$=0.38 for the material parameters and $\Delta T$=1000° C. as the temperature differential between growth and room temperature, a 0.2 ppm/° C. ($\Delta\alpha$) CTE mismatch will generate a 60 MPa film stress and allow up to approximately 380 μm GaN thickness on the AlN substrate without cracking. This is a sufficiently thick GaN film to be considered as a practical donor seed substrate for subsequent layer-transfer to manufacture a GaN device template for applications such as HB-LED, power electronics and RF (Radio-Frequency) GaN. Of course, a thinner GaN film can also serve directly as a template substrate for such applications.

Materials other than (111) single crystal silicon, however, may offer a more close alignment in lattice spacing with GaN. One example of such a material is single crystal silicon carbide (SiC).

Single crystal SiC is available in a variety of forms, including 3C, 4H, and 6H. The 4H SiC form offers a close lattice match (~4%) with GaN. Of course, 3C, 6H, or other SiC polytypes may also be utilized according to various embodiments.

Figure 4:
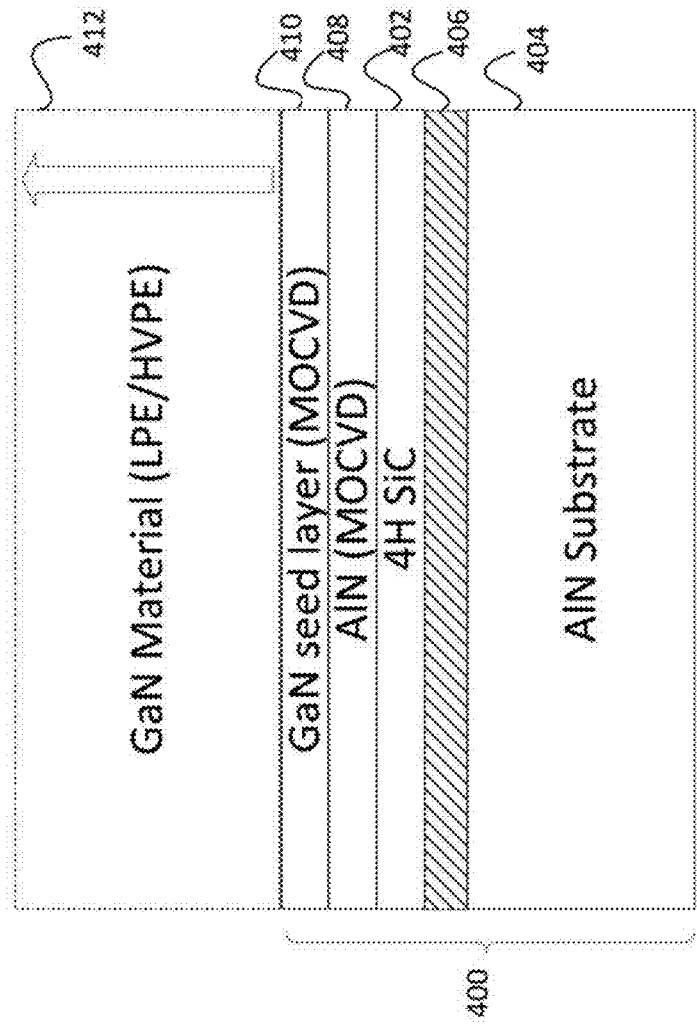
FIG. 4 shows a simplified view of a process according to an embodiment.

Accordingly, FIG. 4 shows a simplified view of an alternative embodiment of a GaN seed workpiece 400 featuring a 4H SiC layer 402 bonded to an underlying AlN substrate 404 through a bonding layer 406. That bonding layer may be an oxide bonding layer, including but not limited to spin-on-glass, for example. Again, a MOCVD AlN layer 408 can serve as a precursor layer to the MOCVD GaN seed layer 410, which in turn serves as the template for thickened GaN 412 which may be grown upon the seed template workpiece utilizing LPE and/or HVPE techniques.

Here it is noted that the AlN precursor of this particular embodiment may be optional. Other low-temperature nucleation layers (or even none) could alternatively be selected depending on the layer itself.

As with the embodiment of FIG. 3A, the 4H type SiC layer is formed by a controlled cleaving from a bulk substrate. Here, that controlled cleaving process may comprise implanting the bulk SiC material with particles, followed by exposure to relatively high temperatures of around 600-900° C. Exemplary particle implantation conditions to form a cleave region in the 4H type SiC is 5-10×10¹⁶ H⁺/cm² at 300° C. implantation temperature, and 180 keV proton energy, 800-900° C. anneal for about 2 hours to achieve cleaving and transfer of the SiC. Incorporated by reference herein for all purposes is Amarasinghe et al., "*Properties of H⁺Implanted 4H-SiC as Related to Exfoliation of Thin Crystalline Films*", ECS Journal of Solid State Science and Technology, 3 (3) pp. 37-42 (2014).

In order to reduce exposure of the seed workpiece to excessively high thermal budgets (high anneal temperature causing bonded substrate breakage and/or impractically long anneal time) associated with cleaving of SiC, it may be possible to subject an implanted (4H or other polytype) SiC bulk ingot to thermal energy prior to bonding and cleaving. This additional thermal exposure may take the form of annealing and/or laser treatment to weaken the bond between the SiC bulk ingot and remaining SiC material overlying the cleave region formed by the implantation. The purpose of lowering the bonded thermal budget is to allow layer transfer of the SiC film onto the target substrate without breaking the bonded pair. The implanted SiC donor substrate can be thermally annealed to lower the bonded pair cleaving thermal budget using methods explained, for example in U.S. Pat. No. 6,162,705 and/or U.S. Pat. No. 6,013,563, both of which are incorporated by reference in their entireties herein for all purposes. Thermal annealing at a level short of blistering would be effective. As an example, reducing the temperature to a level of about 25-50° C. lower than that required to develop blistering would be effective in limiting the post-bond anneal thermal budget.

Figure 5:
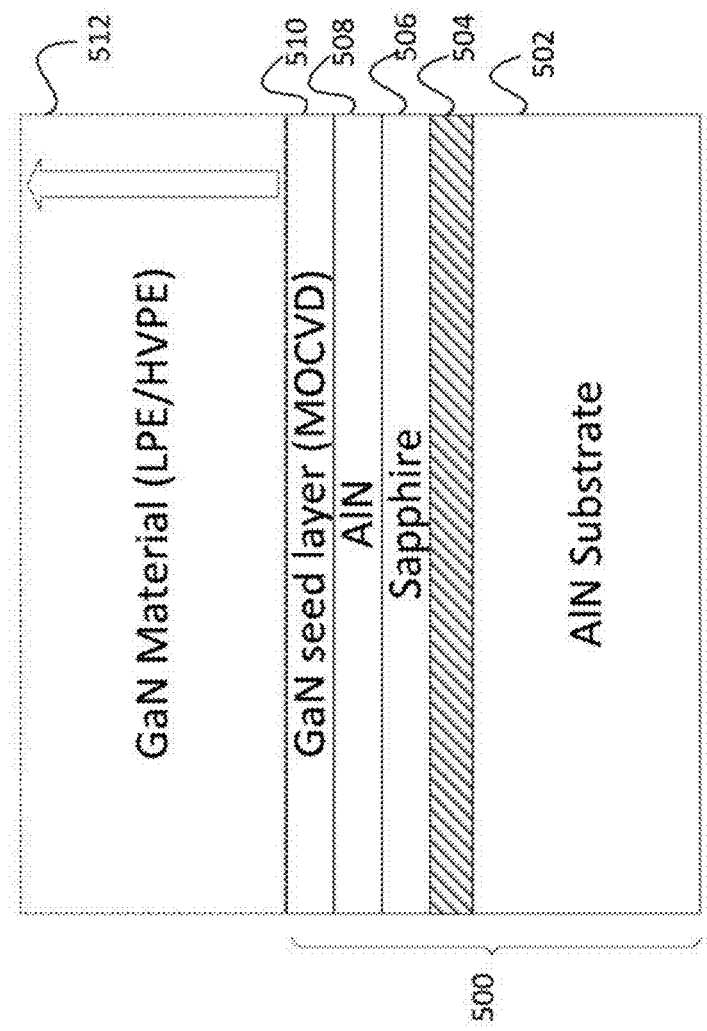
FIG. 5 shows a simplified view of a process according to an embodiment.

FIG. 5 shows another possible embodiment of a process. In particular, this approach uses a thin layer of layer-transferred single crystal sapphire (Al₂O₃) as the initial growth surface.

The template workpiece 500 of FIG. 5 comprises an AlN substrate 502 bearing an oxide bonding layer 504. That oxide bonding layer may have a thickness, for example, of between about 200-400 nm.

Attached to the oxide bonding layer 504 is a sapphire layer 506. This sapphire layer may have a c-cut orientation in order to provide desirable lattice matching. However, other forms of single crystal sapphire are known and could potentially be used, including a-cut, m-cut, and r-cut oriented materials.

The sapphire layer may have a thickness of between about 0.1-5 m. It may be formed on the template substrate by separation from a high quality ingot utilizing a controlled cleaving process as is described herein.

A thin layer of epitaxially grown AlN 508 is in turn formed over the single crystal sapphire layer. This AlN layer is formed by MOCVD to a thickness of between about 50-200 nm. Alternatively, the AlN (e.g., ~20-80 nm in thickness) could be formed by physical vapor deposition (PVD) techniques. Capping the sapphire, the AlN layer serves as a precursor layer to the GaN seed layer that is to be formed.

In particular, FIG. 5 further shows a GaN seed layer 510 overlying the AlN capping layer. That GaN seed layer is formed at high quality overlying the AlN layer 508, also utilizing MOCVD techniques. The GaN may be polar or non-polar, and may be c-plane or of another type.

It is noted that a polycrystalline AlN (P-AlN) has a lower CTE mismatch with c-plane GaN than the CTE difference between GaN and sapphire. The thermal conductivity of P-AlN is also substantially higher than sapphire. This will reduce the magnitude of thermal gradients arising in the template workpiece, and improve temperature uniformity during processing.

The surface of the high quality GaN layer offered by the workpiece, in turn serves as a template for the growth of additional GaN material to achieve substantial thicknesses. This is shown in FIG. 5, where further high quality GaN material 512 is grown to greater thickness over the GaN seed layer utilizing techniques such as LPE and/or HVPE.

One possible benefit of the use of a layer transferred sapphire layer is that even though there is some (~13%) lattice mismatch between the sapphire and the GaN grown thereon, the CTE match of the substrate is still an advantage for thick GaN growth. Also, the use of sapphire as growth surface for GaN is well-researched, for example as described by the Pinnington et al. article that is incorporated by reference above.

In summary, embodiments as shown in FIGS. 3A-C, 4, and 5 allow the formation of donor workpieces comprising high quality GaN material, by incorporating CTE/lattice compatible materials such as (111) Si, N type SiC, and/or sapphire. Controlled cleaving processes allow those CTE/lattice compatible materials to be separated from large diameter (e.g., >2") bulk materials, thereby also allowing the overlying grown GaN to exhibit the same corresponding large area. These substrates can in turn be utilized to manufacture GaN-based devices such as HB-LED, power electronics and RF-GaN. These can be cost-effectively fabricated in large-diameter (4"-12") sizes on insulating or conductive base substrates. Using polycrystalline AlN as a base substrate for example, its high thermal conductivity and electrical resistivity could be used for lateral power device structures. Use of an electrically conductive molybdenum substrate (and a conductive bonding layer) could be beneficial for fabricating vertical power devices. The integration of an optically reflective bond layer could also allow top emitting LED structures and together with a conductive base substrate, a top emitting vertical LED structure.

It is further noted that the choice of material for both the workpiece and for the additional layer, can play a role in determining a character of the stress/strain experienced by the additional layer. For example, the choice of workpiece/additional layer may also determine a relative mismatch in coefficient in thermal expansion between them, which in turn can contribute to both the polarity and magnitude of stress/strain arising in the additional layer over a range of temperatures. In view of the above, the workpiece and/or the additional layer materials can be carefully selected to achieve a desired layer of stress/strain within the additional layer over various processing steps.

In specific embodiments, a silicon dioxide or AlN layer can be applied through sputtering or PECVD and optionally densified prior to an implant step. If a film or film stack is applied, it may be of limited total thickness to allow the implant at the selected energy to penetrate into the bulk at the desired cleave depth. Of course there can be other variations, modifications, and alternatives.

In accordance with particular embodiments, the high energy particles can be generated using a particle accelerator. Here, the accelerator can either be a linear accelerator, a plasma immersion ion implantation tool, an ion shower. Under appropriate conditions, mass-selected or non mass-selected implant technologies can be used.

In a specific embodiment the particles cause formation of a plurality of gettering sites or an accumulation region within a cleave region, which is provided beneath the surface region to define a thickness of the bulk material that is to be detached (in some embodiments as a free standing layer). The first plurality of high energy particles may provide an implant profile having a peak concentration and a distribution spatially disposed within a depth of the semiconductor substrate. The distribution can have a width of about 2 μm and less, where this depth variation of an implant concentration profile is called the longitudinal straggle. For a 2 MeV hydrogen implant in GaN, the implant depth is about 25 μm, and the straggle is about 0.77 μm.

In certain embodiments, the cleave region is maintained at a first temperature, which can be provided directly or indirectly. That is, the temperature can be provided by convection, conduction, radiation, or a combination of these techniques according to a specific embodiment. Additionally, the high-energy particle beam may also provide part of the thermal energy and in combination with an external temperature source to achieve the desired implant temperature. In certain embodiments, the high-energy particle beam alone may provide the entire thermal energy desired for implant. That is, the high energy particle beam can be provided that directly causes energy to be converted into thermal energy to increase the temperature of the substrate or bulk material. Of course there can be other variations, modifications, and alternatives.

Depending upon the application, according to particular embodiments smaller mass particles are generally selected to decrease the energy requirement for implantation to a desired depth in a material and to reduce a possibility of damage to the material region according to a preferred embodiment. That is, smaller mass particles more easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral or charged particles including ions such as ion species of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

For example, using hydrogen as the implanted species into a GaN surface as an example, the implantation process is performed using a specific set of conditions. Implantation dose ranges of hydrogen from about $5\times10^{16}$ to about $5\times10^{17}$ atoms/cm$^2$, and preferably the dose of implanted hydrogen is less than about $2\times10^{17}$ atoms/cm$^2$, and may be less than about $5\times10^{16}$ atoms/cm$^2$. Implantation energy ranges from about 0.5 MeV and greater to about 2 MeV for the formation of thick films useful for opto-electronic applications. In certain bonded substrate embodiments implantation energy may be below 500 keV, for example 5-180 keV. Implantation temperature ranges from about −50 to about +500 Degrees Celsius, may be between about 100-500 Degree Celsius, and is preferably less than about 700 Degrees Celsius to prevent a possibility of hydrogen ions from diffusing out of the implanted GaN material. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using GaN as an example, the energy range of implantation can be quite large and span from a few keV for template formation for HB-LED or GaN power electronics applications where a subsequent epitaxial growth is needed to fabricate the GaN device structure, to many MeV yielding substrates measuring tens of micron in thickness for use as a kerfless freestanding wafer starting material. The general range of implant depth as a function of the implant energy can be calculated using, for example SRIM 2013 (Stopping Range In Matter) or a Monte Carlo simulation program (http://www.srim.org/). In a specific embodiment, the GaN film thickness ranges from about 0.05 micrometers to about 1 micrometers using proton implant energy ranges from about 5 keV to about 180 keV. In other embodiments the GaN film may be a free standing GaN layer having a thickness from about 10 micrometers to about 70 micrometers. Of course there can be other variations, modifications, and alternatives.

The terms "detached" or "transferred GaN thickness" in this context mean that the GaN film thickness formed by the implanted ion range can be released to a free standing state or released to a permanent substrate or a temporary substrate for eventual use as a free standing substrate, or eventually mounted onto a permanent substrate. In some embodiments, the GaN material is sufficiently thick and free from a handle or transfer substrate, which acts as a supporting member. Of course, the particular process for handling and processing of the film will depend on the specific process and application.

Embodiments may optionally perform a thermal treatment process on the semiconductor substrate or bulk material to further form the plurality of gettering sites within the cleave region. That is, the thermal treatment process anneals out and/or quenches the cleave region to fix the plurality of first particles in place. The thermal treatment provides a fixed network of defects that can act as efficient sites for gettering and accumulating particles in a subsequent implantation or particle accumulation/diffusion process.

Without being tied to a particular theory or mechanism, in a specific embodiment, the increased temperature is believed to precipitate a network of permanent defects, and may also trap a substantial portion of hydrogen from the first plurality of particles. The defect layer, which is substantially permanent, provides a site for efficient collection and trapping of particles from a subsequent implant and/or diffusion process, which will be described in more detail throughout the present specification and more particularly below.

In accordance with one embodiment, the optional thermal treatment can occur using conduction, convection, radiation, or any combination of these techniques. The particle beam may also provide part of the thermal energy and in combination with an external temperature source to achieve the desired implant temperature. In certain embodiments, the particle beam alone may provide the entire thermal energy desired for implant. Of course, there can be other variations, modifications, and alternatives.

A specific embodiment may include subjecting the surface region of the semiconductor substrate or bulk material to a second plurality of high energy particles, which may be generated using a linear accelerator or other accelerated ion implanter such as a PIII system. The method may include a second plurality of high energy particles, which are provided in the semiconductor substrate or bulk material. The second particles are introduced into the cleave region, which increases a stress level of the cleave region from a first stress level to a second stress level from the second plurality of high velocity particles. In a specific embodiment, the second stress level is suitable for a subsequent cleaving process. In a particular embodiment, the semiconductor substrate or bulk material is maintained at a second temperature, which is higher than the first temperature.

Using hydrogen as the species implanted into the bulk single crystal GaN material in the second implantation step as an example, the implantation process is performed using a specific set of conditions. Implantation dose ranges from about $5\times10^{16}$ to about $5\times10^{17}$ atoms/cm$^2$, and preferably the dose is less than about $1\times10^{17}$ atoms/cm$^2$. Implantation energy ranges from about 5 keV and greater to about 0.5 MeV and greater for the formation of thicker films. Implant dose rate can be provided at about 500 microamperes to about 100 milliamperes and a total dose rate can be calculated by integrating an implantation rate over the expanded beam area. Implantation temperature ranges from about −50 Degree Celsius to about 700 Degrees Celsius, and is preferably less than about 500 Degrees Celsius. In a specific embodiment, the temperature and dose are selected to allow for efficient capture of molecular hydrogen, while there may be some diffusion of mono-atomic hydrogen. Of course, the type of ion used and process conditions depend upon the application.

For higher implant energies, it may be useful to have a substantially pure proton implantation (e.g., positive or negatively charged) to allow for a maximum range of the cleaving plane within the reusable substrate. Using GaN as an example, the energy range of implantation can be large and span from a few keV for template formation for HB-LED or GaN power electronics applications where a subsequent epitaxial growth is needed to fabricate the GaN device structure, to many MeV yielding substrates measuring tens of micron in thickness for use as a kerfless freestanding wafer starting material. The general range of implant depth as a function of the implant energy can be calculated using, for example SRIM 2013 (Stopping Range In Matter) or a Monte Carlo simulation program (http://www.srim.org/). In a specific embodiment, the GaN film thickness ranges from about 0.05 micrometers to about 1 micrometers using proton implant energy ranges from about 5 keV to about 180 keV. In some embodiments the GaN film may be a free standing GaN layer having a thickness from about 10 micrometers to about 70 micrometers. Of course there can be other variations, modifications, and alternatives.

Effectively, the implanted particles add stress or reduce fracture energy along a plane parallel to the top surface of the substrate or bulk material at the selected depth. The energies depend, in part, upon the implantation species and conditions. These particles reduce a fracture energy level of the substrate or bulk material at the selected depth. This allows for a controlled cleave along the implanted plane at the selected depth. Implantation can occur under conditions such that the energy state of the substrate or bulk material at all internal locations is insufficient to initiate a non-reversible fracture (i.e., separation or cleaving) in the substrate or bulk material. It should be noted, however, that implantation does generally cause a certain amount of defects (e.g., micro-detects) in the substrate or bulk material that can typically at least partially be repaired by subsequent heat treatment, e.g., thermal annealing or rapid thermal annealing.

A mass-selected high-energy implant approach, which has the appropriate beam intensity could be used to manufacture thicker cleaved bulk materials. To be cost-effective, the implant beam current should be on the order of a few tens of milliamps of $H^+$ or H ion beam current. If the system can implant such sufficiently high energies, $H_2^+$ ions can also be advantageously utilized for achieving higher dose rates. Ion implant apparatuses useful for embodiments of the present invention have been made recently available by the use of DC electrostatic particle accelerators such as the DYNAMITRON proton accelerator available from Ion Beam Applications SA, Belgium). Other forms of DC electrostatic accelerators which may be used include Van de Graaff or Tandem Van de Graaff accelerator types.

Still other forms of particle accelerators suitable for use in accordance with embodiments of the present invention may include radio frequency (RF) particle accelerators such as a cyclotron or a RF linear accelerator (RF Linac). Examples of possible particle accelerator types include radio-frequency quadrupole linear accelerator (RFQ-Linac) or Drift-Tube Linac (DTL), or RF (Radio)-Focused Interdigitated (RFI) technology. These are available from companies such as Accsys Technology Inc. of Pleasanton, Calif., Linac Systems, LLC of Albuquerque, N. Mex. 87109, and others.

In a specific embodiment, these approaches use RF acceleration of an extracted proton beam to increase the total energy of the proton beam from a range of approximately 20-100 keV to 0.5 to 7 MeV or more. The output beam is usually on the order of a few millimeters in diameter and for use in this application would require the use of beam expansion to the order of a few hundred millimeters on a side to a meter or more in order to keep the power flux impinging on the target surface from becoming too large and possibly overheating or damaging the target surface. The proton current available with these technologies can be up to 100 mA or more. As a specific example, assuming 100 kW of beam power, a 3.25 MeV RFQ/RFI-Linac would yield a proton beam current of about 31 mA. Using a dose of approximately $1 \times 10^{17}$ $H/cm^2$ and an expanded beam of about 500 mm×500 mm, the GaN area processed per hour at the target implantation dose is about 0.7 square meters while the power flux is kept to about 13 Watts/$cm^2$. This combination of parameters makes this approach particularly practical for cost effective HB-LED substrate material production. Of course, there can be other variations, alternatives, and modifications.

Optionally, specific embodiments may include a thermal treatment process after the implanting process. According to a specific embodiment, the present method uses a thermal process ranging from about 150 to about 800 Degrees Celsius for GaN material. In an embodiment, the thermal treatment can occur using conduction, convection, radiation, or any combination of these techniques. The high-energy particle beam may also provide part of the thermal energy and in combination with an external temperature source to achieve the desired implant temperature. In certain embodiment, the high-energy particle beam alone may provide the entire thermal energy desired for implant. In a preferred embodiment, the treatment process occurs to season the cleave region for a subsequent cleave process. Of course, there can be other variations, modifications, and alternatives.

Specific embodiments may include a cleave initiation step, wherein some energy is applied to the cleave portion to begin cleaving. As described in detail below, this cleave initiation could involve the application of different types of energy, having different characteristics.

Specific embodiments include a step of freeing the thickness of detachable material, (which may or may not be free standing), using a cleaving process. In a specific embodiment, the step of freeing can be performed using a controlled cleaving process. The controlled cleaving process provides a selected energy within a portion of the cleave region of the donor bulk GaN material. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method in accordance with an embodiment of the present invention frees the thickness of material (which may be free standing) from the substrate or bulk material to completely remove the thickness of material. Of course, there can be other variations, alternatives, and modifications.

A method may use one or more patterned regions to facilitate initiation of a cleaving action. In a specific embodiment, the present method provides a semiconductor substrate having a surface region and a thickness. The method includes subjecting the surface region of the semiconductor substrate to a first plurality of high energy particles generated using a particle accelerator to form a patterned region of a plurality of gettering sites within a cleave region. In a preferred embodiment, the cleave region is provided beneath the surface region to defined a thickness of material to be detached. The semiconductor substrate is maintained at a first temperature. The method also includes subjecting the semiconductor substrate to a treatment process, e.g., thermal treatment. The method includes subjecting the surface region of the semiconductor substrate to a second plurality of high energy particles, which have been provided to increase a stress level of the cleave region from a first stress level to a second stress level. The method includes initiating the cleaving action at a selected region of the patterned region to detach a portion of the thickness of detachable material using a cleaving process and freeing the thickness of detachable material using a cleaving process.

In one embodiment, the patterned implant sequence subjects the surface to a dose variation where the initiation area is usually developed using a higher dose and/or thermal budget sequence. Propagation of the cleaving action to complete the cleaving action can occur using additional dosed regions to guide the propagating cleave front. Alternatively, cleaving propagation can be accomplished by following a depth that is guided using stress-control. Propagation of the cleaving can be achieved by following a natural crystallographic cleave plane. One or more of these techniques may be applied in conjunction with one another. Some or most of the area may be implanted at a lesser dose or not implanted at all depending on the particular cleaving technique used. Such lower dosed regions can help improve overall productivity of the implantation system by reducing the total dose needed to detach each film from the substrate.

In a specific embodiments, methods can perform other processes. For example, the method can place the thickness of detached material on a support member, which is later processed. Additionally or optionally, the method in accordance with an embodiment of the present invention performs one or more processes on the semiconductor substrate or bulk material before subjecting the surface region with the first plurality of high energy particles, or between the implanting step(s) and the cleaving step. Depending upon the particular embodiment, the processes can be for the formation of illumination devices, or layers used within a cell process, integrated circuits, optical devices, any combination of these, and the like. Of course, there can be other variations, modifications, and alternatives.

As described above, improved techniques for removing a thin film of material from a substrate using a controlled cleaving action are provided. This technique allows an initiation of a cleaving process on a substrate using a single or multiple cleave region(s) through the use of controlled energy (e.g., spatial distribution) and selected conditions to allow an initiation of a cleave front(s) and to allow it to propagate through the substrate to remove a thin film of material from the substrate.

In a specific embodiment, a process is provided for forming a film of material from a donor using a controlled cleaving process. The process includes a step of introducing energetic particles (e.g., charged or neutral molecules, atoms, or electrons having sufficient kinetic energy) through a surface of a donor to a selected depth underneath the surface, where the particles are at a relatively high concentration to define a thickness of donor material (e.g., thin film of detachable material) above the selected depth. To cleave the donor material, the method provides energy to a selected region of the donor to initiate a controlled cleaving action in the donor, whereupon the cleaving action is made using a propagating cleave front(s) to free the donor material from a remaining portion of the donor.

A cleave may be initiated by subjecting the material with sufficient energy to fracture the material in one region, causing a cleave front, without uncontrolled shattering or cracking. The cleave front formation energy (E) must often be made lower than the bulk material fracture energy (Etna) at each region to avoid shattering or cracking the material. The directional energy impulse vector in diamond cutting or the scribe line in glass cutting are, for example, the means in which the cleave energy is reduced to allow the controlled creation and propagation of a cleave front. The cleave front is in itself a higher stress region and once created, its propagation requires a lower energy to further cleave the material from this initial region of fracture. The energy required to propagate the cleave front is called the cleave front propagation energy (4). The relationship can be expressed as:

$$Ec=Ep+[\text{cleave front stress energy}]$$

A controlled cleaving process is realized by reducing Ep along a favored direction(s) above all others and limiting the available energy to below the Ep of other undesired directions. In any cleave process, a better cleave surface finish occurs when the cleave process occurs through only one expanding cleave front, although multiple cleave fronts do work.

Numerous benefits are achieved over pre-existing techniques using the present invention. In particular, the present invention uses controlled energy and selected conditions to preferentially cleave a thin film of material from a donor which includes multi-material sandwiched films. This cleaving process selectively removes the thin film of material from the substrate while preventing a possibility of damage to the film or a remaining portion of the substrate. Accordingly, the remaining substrate portion can be re-used repeatedly for other applications.

Additionally, the present invention uses a relatively low temperature during the controlled cleaving process of the thin film to reduce temperature excursions of the separated film, donor, or multi-material films according to other embodiments. This lower temperature approach allows for more material and process latitude such as, for example, cleaving and bonding of materials having substantially different thermal expansion coefficients. In other embodiments, the present invention limits energy or stress in the substrate to a value below a cleave initiation energy, which generally removes a possibility of creating random cleave initiation sites or fronts. This reduces cleave damage (e.g., pits, crystalline defects, breakage, cracks, steps, voids, excessive roughness) often caused in pre-existing techniques. Moreover, embodiments can reduce damage caused by higher than necessary stress or pressure effects and nucleation sites caused by the energetic particles as compared to pre-existing techniques.

A variety of techniques can be used to implant the energetic particles into the GaN material. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Examples of plasma immersion ion implantation techniques are described in "Recent Applications of Plasma Immersion Ion Implantation," Paul K. Chu, Chung Chan, and Nathan W. Cheung, SEMICONDUCTOR INTERNATIONAL, pp. 165-172, June 1996, and "Plasma Immersion Ion Implantation—A Fledgling Technique for Semiconductor Processing," P. K. Chu, S. Qin, C. Chan, N. W. Cheung, and L. A. Larson, MATERIALS SCIENCE AND ENGINEERING REPORTS: A REVIEW JOURNAL, pp. 207-280, Vol. R17, Nos. 6-7, (Nov. 30, 1996), which are both hereby incorporated by reference for all purposes. Of course, techniques used depend upon the application.

A basic configuration of one PIII system may utilize a target holder supporting the target to be implanted. The target holder may comprise a high-voltage isolated cooled chuck with electrostatic or mechanical clamping to allow the target material to be thermally contacted to the target holder. This can be accomplished by conduction cooling (e.g. through an elastomer or other compliant layer allowing efficient contacting of the backside of the target) or by convection cooling (e.g. by developing gas pressure between the backside of the target and the target holder). Sometimes, a combination of conduction and convection cooling may be employed. During this plasma soak time, the target is directly immersed in the plasma.

A target holder and target may be briefly pulsed to a large negative voltage (−V). During this time, a sheath free of charged particles is developed around the target holder assembly. The voltage is dropped across the thickness of the sheath.

Implantation occurs by the positive charges diffusing across the plasma/sheath interface to accelerate and strike the surface of the target holder assembly with energy equal to V. For example, a pulse of −40 kV could accelerate H+ protons within a hydrogen plasma to an energy of 40 keV. This implantation process continues at a rate determined by parameters such as the plasma density and ion specie. To avoid arcing, the high-voltage may be applied for a brief period of time and repeated at a selected repetition rate. Typical PIII operating parameters can be 20-1000 Hz repetition frequency (Fr), and pulse widths (Tp) of a few microseconds to more than 100 microseconds. If the peak ion current (Iion) and effective target holder area (A) are known, the dose rate can be calculated as:

Dose Rate (ions/cm$^2$)=$I$ion×Fr×$Tp/qA$, where $q$ is the electronic charge.

When charged particles hit the target holder assembly, secondary electrons are ejected from the surface to be accelerated in the reverse direction. The electron yield (number of electrons emitted per positive charged particle implanted) is called gamma (γ).

Typical gamma factors are 2-5. Therefore, the net pulse current is dominated by the secondary electron current. Since these electrons hit the plasma chamber walls and decelerate, x-rays are produced at implant energies (V) exceeding 30-40 kV. In an example, the total current and implant power may be:

Implant Current=$I$ion×(1+γ)×Fr×$Tp$

Implant Power=$I$ion×(1+γ)×Fr×$Tp$×$V$

Depending upon the application, smaller mass particles may reduce a possibility of damage to the material region. That is, smaller mass particles easily travel through the substrate material to the selected depth without substantially damaging the material region that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes, rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to the selected depth underneath the surface.

For example, using hydrogen as the implanted species into a GaN surface as an example, the implantation process may be performed using a specific set of conditions. Implantation dose ranges of hydrogen from about $5\times10^{16}$ to about $5\times10^{17}$ atoms/cm$^2$, and the dose of implanted hydrogen can be less than about $2\times10^{17}$ atoms/cm$^2$, and may be less than about $5\times10^{16}$ atoms/cm$^2$. Implantation energy may range from about 0.5 MeV and greater to about 2 MeV for the formation of thick films useful for opto-electronic applications. In certain bonded substrate embodiments implantation energy may be below 500 keV, for example 5-180 keV. Implantation temperature ranges from about −50 to about +500 Degrees Celsius, may be between about 100-500 Degree Celsius, and can be less than about 700 Degrees Celsius to prevent a possibility of hydrogen ions from diffusing out of the implanted GaN material. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-defects) in the substrate that can typically at least partially be repaired by subsequent heat treatment, e.g., thermal annealing or rapid thermal annealing.

A controlled cleaving process may utilize pulsed energy. A pulse 1 has an energy level which exceeds average cleaving energy (E), which is the necessary energy for initiating the cleaving action. Pulses 2 and 3 are made using lower energy levels along the cleave front to maintain or sustain the cleaving action. In a specific embodiment, the pulse is a laser pulse where an impinging beam heats a selected region of the substrate through a pulse and a thermal pulse gradient causes supplemental stresses which together exceed cleave formation or propagation energies, which create a single cleave front. In preferred embodiments, the impinging beam heats and causes a thermal pulse gradient simultaneously, which exceeds cleave energy formation or propagation energies. More preferably, the impinging beam cools and causes a thermal pulse gradient simultaneously, which exceeds cleave energy formation or propagation energies.

Optionally, a built-in energy state of the substrate or stress can be globally raised toward the energy level necessary to initiate the cleaving action, but not enough to initiate the cleaving action before directing the multiple successive impulses to the substrate according to the present invention. The global energy state of the substrate can be raised or lowered using a variety of sources such as chemical, mechanical, thermal (sink or source), or electrical, alone or in combination. The chemical source can include a variety such as particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used also depends upon the application. As noted, the global source increases a level of energy or stress in the material region without initiating a cleaving action in the material region before providing energy to initiate the controlled cleaving action.

In a specific embodiment, an energy source elevates an energy level of the substrate cleave plane above its cleave front propagation energy but is insufficient to cause self-initiation of a cleave front. In particular, a thermal energy source or sink in the form of heat or lack of heat (e.g., cooling source) can be applied globally to the substrate to increase the energy state or stress level of the substrate without initiating a cleave front. Alternatively, the energy source can be electrical, chemical, or mechanical. A directed energy source provides an application of energy to a selected region of the substrate material to initiate a cleave front which self-propagates through the implanted region of the substrate until the thin film of material is removed. A variety of techniques can be used to initiate the cleave action. These techniques are described by way of the Figs. below.

In an embodiment, the energy level or state of the substrate is raised using a global energy source above the cleave front propagation energy state, but is lower than the energy state necessary to initiate the cleave front. To initiate the cleave front, an energy source such as a laser directs a beam in the form of a pulse at an edge of the substrate to initiate the cleaving action. Alternatively, the energy source can be a cooling fluid (e.g., liquid, gas) that directs a cooling medium in the form of a pulse at an edge of the substrate to initiate the cleaving action. The global energy source maintains the cleaving action which generally requires a lower energy level than the initiation energy.

An alternative aspect utilizes an energy source to increase a global energy level of the substrate using a light beam or heat source to a level above the cleave front propagation energy state, but lower than the energy state necessary to initiate the cleave front. The substrate undergoes a rotational force turning clockwise on top surface and a rotational force turning counter-clockwise on the bottom surface which creates stress at the implanted region to initiate a cleave front. Alternatively, the top surface undergoes a counter-clockwise rotational force and the bottom surface undergoes a clockwise rotational force. Of course, the direction of the force generally does not matter in this embodiment.

The removed material region provides a thin film of GaN material for processing. The GaN material possesses limited surface roughness and desired planarity characteristics for use in a epitaxial growth substrate. In certain embodiments, the surface roughness of the detached film has features that are less than about 60 nm, or less than about 40 nm, or less than about 20 nm. Accordingly, embodiments of the present invention may provide thin GaN films which can be smoother and more uniform than pre-existing techniques.

In a specific embodiment, the energy source can be a fluid jet that is pressurized (e.g., compressional) according to an embodiment of the present invention. In an embodiment, the energy source can be a compressional source such as, for example, compressed fluid that is static. Optionally, a mechanical force, as from a pin or blade, may be applied to the edge of the implanted region to initiate the cleaving process, which typically reduces the maximum pressure differential required between the chamber and the ambient.

Embodiments may be practiced at temperatures that are lower than those used by pre-existing techniques. In particular, embodiments do not require increasing the entire substrate temperature to initiate and sustain the cleaving action as pre-existing techniques. In some embodiments for GaN wafers and hydrogen implants, substrate temperature does not exceed about 500° C. during the cleaving process. Alternatively, substrate temperature does not exceed about 400° C. during the cleaving process. Alternatively, substrate temperature is kept substantially below implanting temperatures via a thermal sink, e.g., cooling fluid, cryogenic fluid. Accordingly, embodiments of the present invention may reduce a possibility of unnecessary damage from an excessive release of energy from random cleave fronts, which generally improves surface quality of a detached film(s) and/or the substrate(s). Accordingly, embodiments of the present invention may provide resulting films on substrates at higher overall yields and quality.

A substrate can be disposed on a workpiece such as a stiffener or the like before the controlled cleaving process. The workpiece joins to a top surface or implanted surface of the substrate to provide structural support to the thin film of material during controlled cleaving processes. The workpiece can be joined to the substrate using a variety of bonding or joining techniques, e.g., electro-statics, adhesives, interatomic, thermo-compression. Some of these bonding techniques are described herein. The workpiece can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of workpiece used will depend upon the application.

Alternatively, the substrate having the film to be detached can be temporarily disposed on a transfer substrate such as a stiffener or the like before the controlled cleaving process. The transfer substrate joins to a top surface or implanted surface of the substrate having the film to provide structural support to the thin film of material during controlled cleaving processes. The transfer substrate can be temporarily joined to the substrate having the film using a variety of bonding or joining techniques, e.g., electro-statics, adhesives, interatomic. Some of these bonding techniques are described herein.

The transfer substrate can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of transfer substrate used will depend upon the application. Additionally, the transfer substrate can be used to remove the thin film of material from the cleaved substrate after the controlled cleaving process.

A GaN HB-LED Growth Substrate Process for fabricating a GaN HB-LED growth substrate according to particular embodiments, may be briefly outlined as follows:

(1) Provide a donor GaN bulk material (which may be a multi-stack wafer comprising a GaN layer bonded onto a metal or metal-alloy substrate and optionally coated with additional layers of material);

(2) Introduce particles into the donor GaN bulk material to a selected depth to define a thickness of GaN film;

(3) Provide a target substrate material (which may be coated with thin-film(s) of material);

(4) Bond the donor GaN bulk material to the target substrate material by joining the implanted face to the target substrate material;

(5) Increase global stress (or energy) of implanted region at selected depth without initiating a cleaving action (optional);

(6) Provide stress (or energy) to a selected region of the bonded substrates to initiate a controlled cleaving action at the selected depth;

(7) Provide additional energy to the bonded substrates to sustain the controlled cleaving action to free the thickness of GaN film from the donor GaN bulk material (optional);

(8) Complete bonding of donor GaN bulk material to the target substrate; and (9) Polish a surface of the thickness of GaN film.

The above sequence of steps provides a step of initiating a controlled cleaving action using an energy applied to a selected region(s) of a multi-layered substrate structure to form a cleave front(s) according to the present invention. This initiation step begins a cleaving process in a controlled manner by limiting the amount of energy applied to the substrate. Further propagation of the cleaving action can occur by providing additional energy to selected regions of the bulk material to sustain the cleaving action, or using the energy from the initiation step to provide for further propagation of the cleaving action. This sequence of steps is merely an example and should not limit the scope of the claims defined herein. Further details with regard to the above sequence of steps described below.

If a substitutional GaN HB-LED growth substrate comprising a sapphire workpiece or target substrate with a high-quality GaN growth surface is desired, a modified bond process using insulating layer(s) may be selected. In a particular embodiment, both the GaN surface and the sapphire target substrate can be coated with a bond promoting layer such as a silicon dioxide film and/or an aluminum nitride film. For the GaN donor, this oxide film may be of limited thickness to allow the desired implant depth. For example, a 50 nm film would lower the GaN cleave layer from 250 nm to 200 nm. The oxide film thickness on the sapphire substrate can be selected from a wide range of values that allow good bond yield and device performance. Typical oxide film thickness for the sapphire workpiece is 75-200 nm. One or more films can be applied using a RF or reactive sputtering process or via plasma-enhanced CVD (PECVD) process. In some embodiments an insulating film can be spun on.

After deposition, the low temperature films may be treated to promote good bondability. Typical treatment conditions can include a densification anneal and a clean/etch chemical bath that removes asperities and surface contaminants.

The densification anneal is done in an inert environment at 700-1000° C. for typically 1-10 minutes using a Rapid Thermal Processing or 30-60 minutes in a furnace. Incorporated by reference herein for all purposes is the following paper to Choi et al.: "Densification of Radio Frequency Sputtered Silicon Oxide Films by Rapid Thermal Annealing", Journal of Applied Physics, Vol. 83, No. 4 (February 1998). The oxide film on the GaN can also act as a capping layer which limits GaN decomposition.

Because the densification anneal is typically done at high temperatures, the implant step may be performed after the anneal so as to protect the hydrogen cleave plane from diffusing and being rendered ineffective.

The sapphire substrate can be of different varieties to allow a substitutional sapphire-based growth template to meet the desired specifications. The following are some of the structures and options that can be integrated within this substrate:

1. a single-side polished sapphire for low-cost;
2. a double-side polished sapphire to allow laser lift-off back-end LED manufacturing where the LED layer is removed from the sapphire growth substrate;
3. an integrated pattern on the sapphire substrate to allow light extraction methods similar to PSS (Patterned Sapphire Substrate). Film deposition and planarization steps may be required to allow bonding. An index of refraction of the filler material may be selected to allow the scattering effect to occur efficiently. Aluminum nitride and silicon dioxide may be used.
4. Integrating a reflector layer on a planar or PSS sapphire surface that will act as a mirror layer. Electrical conductivity may also be achieved if the planarization and bonding allows the surface to have exposed metal.

Selected energetic particles implant through the top surface of the donor GaN material to a selected depth, which defines the thickness of the material region, termed the thin film of material. As shown, the particles have a desired concentration at the selected depth (z0). A variety of techniques can be used to implant the energetic particles into the donor GaN material. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Of course, techniques used depend upon the application.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

The process according to certain embodiments uses a step of joining the implanted donor GaN material to a workpiece or target substrate. The workpiece may also be a variety of other types of substrates such as those made of a dielectric material (e.g., quartz, glass, sapphire, silicon nitride, silicon dioxide, aluminum nitride), a conductive material (silicon, polysilicon, group III/V materials, metal), and plastics (e.g., polyimide-based materials). In the present example, however, the workpiece is a CTE-matched metal wafer.

In a specific embodiment, the GaN and target substrate are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of H2O2-H2SO4. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, nitrogen, and oxygen. The activated wafer surface is placed against a face of the other wafer, which has a coat of oxidation thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g. 150 to 250° C.) often needed to cure the SOG after it is applied to surfaces of the wafers.

Alternatively, a variety of other low temperature techniques can be used to join the donor GaN material to the target substrate. For instance, an electro-static bonding technique can be used to join the two together. In particular, one or both wafer surface(s) is charged to attract to the other wafer surface. Additionally, the donor GaN material can be fused to the target substrate using a variety of commonly known techniques such as thermo-compression bonding. Of course, the technique used depends upon the application.

After bonding the wafers into a sandwiched structure, the method includes a controlled cleaving action to remove the substrate material to provide a thin film of substrate material overlying interface layer(s) on the target substrate. The controlled-cleaving occurs by way of selective energy placement or positioning or targeting of energy sources onto the donor and/or target wafer. For instance, an energy impulse(s) can be used to initiate the cleaving action. The impulse (or impulses) is provided using an energy source which include, among others, a mechanical source, a chemical source, a thermal sink or source, and an electrical source.

The controlled cleaving action is initiated by way of any of the previously noted techniques and others. For instance, a process for initiating the controlled cleaving action uses a step of providing energy to a selected region of the substrate to initiate a controlled cleaving action at the selected depth (z0) in the substrate, whereupon the cleaving action is made using a propagating cleave front to free a portion of the substrate material to be removed from the substrate. In a specific embodiment, the method uses a single impulse to begin the cleaving action, as previously noted. Alternatively, the method uses an initiation impulse, which is followed by another impulse or successive impulses to selected regions of the substrate. Alternatively, the method provides an impulse to initiate a cleaving action which is sustained by a scanned energy along the substrate. Alternatively, energy can be scanned across selected regions of the substrate to initiate and/or sustain the controlled cleaving action.

Optionally, an energy or stress of the substrate material is increased toward an energy level necessary to initiate the cleaving action, but not enough to initiate the cleaving action before directing an impulse or multiple successive impulses to the substrate according to the present invention. The global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermo-electric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time varying, spatially varying, or continuous. Still further, any of the above embodiments can be combined or even separated, depending upon the application. Of course, the type of source used depends upon the application. As noted, the global source increases a level of energy or stress in the material region without initiating a cleaving action in the material region before providing energy to initiate the controlled cleaving action.

In an embodiment, the method maintains a temperature which is below a temperature of introducing the particles into the substrate. In some embodiments, the substrate temperature is maintained between −200 and 450° C. during the step of introducing energy to initiate propagation of the cleaving action. Substrate temperature can also be maintained at a temperature below 400° C. In certain embodiments, the method uses a global thermal source and a mechanical source to initiate and maintain the cleaving action.

A final bonding step occurs between the target substrate and thin film of material region according to some embodiments. In one embodiment, one metal wafer has overlying layers of metallic and conductive material including a bond layer of copper, which is deposited overlying the face before cleaving the thin film of material. The copper layer can also be formed using a variety of other techniques, e.g., sputtering. The copper layer between the wafer surfaces are fused together using thermal-compression bonding. Typical thermo-compression processes for Copper-Copper bonding are (i) temperatures between 100-400C, (ii) pressures between 0.5-1 MPa and (iii) process time from a few minutes to a few hours depending on exact conditions.

Under certain conditions, it may be advantageous to change the copper thickness ratio from 50/50 between the donor and target substrate, to one where the donor copper thickness is minimized in order to move the bond layer as close as possible to the cleave plane to facilitate cleave initiation. For example 1 um/1 um copper thermo-compression bond layers can be redesigned to become 0.25 um/2 um (donor Cu thickness/target substrate Cu thickness), to move the bond interface to about 0.25 um from the donor material surface. Using Ansys simulation, the initiation moment-energy coupling is improved from 25% to 31% of the reference configuration during cleave propagation (bond interface coincident with the cleave interface).

Another method to reduce initiation energy according to certain embodiments, would include removing or "trenching" a limited edge area of the donor bulk material coincident with the initiation area prior to bonding. This can increase the edge initiation energy at the cleave plane by 2-3×. This result and improvement was confirmed by using Ansys finite analysis simulations.

The detached surface of the film of GaN material may be rough and need finishing. Finishing occurs using a combination of grinding and/or polishing techniques.

In some embodiments, the detached surface undergoes lapping and polishing steps using, for examples, techniques such as rotating an abrasive material underlaying the detached surface to remove any imperfections or surface roughness therefrom. A machine such as a "PM5 lapping & polishing system" made by a company called Logitech Limited of Glasgow, Scotland (UK) may provide this technique.

Alternatively, chemical mechanical polishing or planarization ("CMP") techniques finish the detached surface of the film. In CMP, a slurry mixture is dripped directly to a polishing surface which is attached to a rotating platen. This slurry mixture can be transferred to the polishing surface by way of a chute, which is coupled to a slurry source. The slurry is often a solution containing alumina abrasive particles and an oxidizer, e.g., sodium hypochlorite (NaOCl) or alkaline colloidal silica, which are sold under trade names of SF1 or Chemlox by Logitech Limited. The abrasive is often an aluminum oxide, aluminum trioxide, amorphous silica, silicon carbide, diamond powder, and any mixtures thereof. This abrasive is mixed in a solution of deionized water and oxidizer or the like. The solution may be acidic.

This acid solution generally interacts with the gallium nitride material from the wafer during the polishing process. The polishing process preferably uses a very rigid polyurethane polishing pad. An example of this polishing pad is one made by Rodel and sold under the trade name of IC-1000. The polishing pad is rotated at a selected speed. A carrier head which picks up the target wafer having the film applies a selected amount of pressure on the backside of the target wafer such that a selected force is applied to the film. The polishing process removes about a selected amount of film material, which provides a relatively smooth film surface for subsequent processing. Depending on whether N-face or Ga-face GaN is to be polished off, slurry with suitable abrasive particle sizes and polishing pads may be used accordingly. As examples, colloidal silica may be used for N-face and sodium hypochlorite may be used for Ga-face.

Other than and/or in addition to polishing, there are a number of other surface preparation options that can be employed to prepare the surface condition of the GaN layer, once it has been transferred from the high quality single crystal GaN bulk substrate to the workpiece. A purpose of this surface preparation is to recover the crystalline quality of the transferred GaN layer that may be compromised or damaged due to the implantation or cleaving step.

a. Thermal annealing in a furnace with or without a protective cap, such as silicon dioxide or AlN. This cap is required if the anneal temperature and ambient gas conditions.

b. For GaN in 1 atm nitrogen ambient, the decomposition temperature of the GaN can be as low as 800-900° C. If a cap layer is used, the anneal temperature without GaN crystal decomposition can be substantially higher.

c. Plasma dry etch to remove a limited thickness of the GaN surface to remove the damaged surface region and allow high-quality epitaxial growth.

d. Wet chemical etch to remove a limited thickness of the GaN surface to remove the damaged surface region and allow high-quality epitaxial growth.

e. Anneal and etch in a MOCVD reactor prior to epitaxial GaN growth. This is similar technique as a. above, except that this can be done in-situ in an MOCVD reactor.

It is of course also possible to use the as-cleaved GaN surface without prior surface preparation if the subsequent epitaxial growth step yields a GaN crystal of sufficient quality. As referenced herein and in the figures, the term "polish" may refer to some sort of surface treatment, which may or may/not include polishing, depending upon the particular embodiment.

Although the above description is in terms of a donor GaN bulk material, others may also be used. For example, the donor can be almost any monocrystalline, polycrystalline, or even amorphous type substrate. Additionally, the donor can be made of sapphire, III/V materials such as gallium arsenide or Group IV materials such as silicon, silicon carbide, and others. The multi-layered substrate can also be used according to the present invention. The multi-layered substrate includes a GaN layer substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

Another embodiment may attach a film of single-crystal film that can serve as a heteroepitaxial growth seed layer. The attachment could occur by placing a frame of the thin crystalline metallic film onto the target substrate and cutting the film at the periphery. The film can be then made permanent by a thermal treatment or the like. Examples of metallic single-crystal films for GaN heteroepitaxial growth are Cu (111) & (110), Mo (111) & (110) using buffer layers such as AlN and HfN. Other metals such as Ag have also been studied as seed layers for GaN growth. Since these metals have ductile properties, in some cases a negative lattice mismatch (metal lattice spacing<GaN lattice spacing) can be addressed by stretching the film prior to mounting onto the target substrate.

In conclusion, at least the following variations falling within the scope of particular embodiments, are noted. Certain embodiments may utilize various underlying substrates and reflector/barrier/encapsulant layers, including backing technology for enhancing cleaving. According to some embodiments, a donor can comprise GaN, Si, SiC or other semiconductor material. After cleaving, the material may be polished/prepared for further growth.

1A. A method comprising:
providing a donor comprising GaN and having a cleave region formed by implanted particles wherein a GaN seed layer is above the cleave region;
bonding the donor to a substrate;
separating the donor along the cleave region to produce the substrate bearing the GaN seed layer;
forming additional GaN over the GaN seed layer utilizing an epitaxial growth technique.

2A. A method as in clause 1A wherein the epitaxial growth technique comprises Liquid Phase Epitaxy (LPE).

3A. A method as in clause 1A wherein the epitaxial growth technique comprises vapor phase epitaxy.

4A. A method as in clause 3A wherein the vapor phase growth technique comprises hydride vapor phase epitaxy (HVPE).

5A. A method as in clause 3A wherein the vapor phase growth technique comprises Metallo-Organic Chemical Vapor Deposition (MOCVD).

6A. A method as in clause 1A wherein the substrate comprises AlN.

7A. A method as in clause 1A wherein the substrate comprises Mullite.

8A. A method as in clause 1A wherein the substrate comprises Molybdenum.

9A. A method as in clause 1A wherein the substrate comprises Tungsten.

10A. A method as in clause 1A further comprising incorporating the additional GaN into an optoelectronic device.

11A. A method as in clause 1A wherein the seed layer has a thickness of between about 100-5000 nm, and the additional GaN has a thickness of between about 0.2-10 cm.

12A. A method as in clause 1A wherein the seed layer has a thickness of between about 0.5-2 um, and the additional GaN has a thickness of between about 0.5-2 cm.

13A. A method as in clause 1A wherein the seed layer has a thickness of between about 0.5-1 um, and the additional GaN has a thickness of between about 0.5-1 cm.

14A. A method as in clause 1A wherein the GaN seed layer comprises non-polar GaN.

15A. A method as in clause 1A wherein the GaN seed layer comprises semi-polar GaN.

16A. A method as in clause 1A wherein the GaN seed layer comprises polar GaN.

17A. A method as in clause 16A wherein the additional GaN is grown from a Ga face of the polar GaN.

18A. A method as in clause 16A wherein the additional GaN is grown from an N face of the polar GaN.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions or deuterium and hydrogen ions to allow for formation of the cleave plane with a modified dose and/or cleaving properties according to alternative embodiments. Still further, the particles can be introduced by a diffusion process rather than an implantation process. Of course there can be other variations, modifications, and alternatives. Therefore, the above description and illustrations should not be taken as limiting the scope of the present invention which is defined by the appended claims.

What is claimed is:

1. A method comprising:
   providing a substrate bearing a bonding layer;
   transferring a layer of additional material comprising silicon carbide to the bonding layer utilizing a first cleave process, the transferring performed within a bonded thermal budget;
   forming GaN over the layer of additional material;
   performing a thermal treatment of an implanted donor of the additional material prior to the bonding, in order to reduce a thermal budget of the first cleave process, wherein the thermal treatment is performed at a first temperature about 25-50° C. lower than a second temperature required to develop blistering; and
   performing a second cleave process to transfer a layer from the GaN for incorporation into an opto-electronic device, wherein the thermal treatment allows the second cleave process to also be performed within the bonded thermal budget.

2. A method as in claim 1 further comprising forming a precursor layer over the layer of additional material.

3. A method as in claim 2 further comprising depositing a GaN seed layer on the precursor layer prior to performing an epitaxial growth technique.

4. A method as in claim 3 wherein the depositing comprises performing Metallo-Organic Chemical Vapor Deposition (MOCVD).

5. A method as in claim 2 wherein the precursor layer comprises AlN.

6. A method as in claim 5 wherein the AlN comprises single-crystal AlN.

7. A method as in claim 1 wherein forming the GaN comprises performing an epitaxial growth technique.

8. A method as in claim 7 wherein the epitaxial growth technique comprises Liquid Phase Epitaxy (LPE).

9. A method as in claim 7 wherein the epitaxial growth technique comprises Hydride Vapor Phase Epitaxy (HVPE).

10. A method as in claim 1 wherein the silicon carbide comprises 4H single crystal silicon carbide.

11. A method as in claim 1 wherein the silicon carbide comprises 6H single crystal silicon carbide.

12. A method as in claim 1 wherein the silicon carbide comprises 3C single crystal silicon carbide.

13. A method as in claim 1 wherein the first cleave process comprises a post-implant, pre-bonding annealing.

14. A method as in claim 1 wherein the thermal treatment comprises an annealing.

15. A method as in claim 1 wherein the thermal treatment comprises laser exposure.

16. A method as in claim 1 wherein the additional material is separated by the cleave process from a bulk material having a width of 2" or greater.

17. A method as in claim 1 wherein the substrate comprises polycrystalline AlN.

18. A method as in claim 1 wherein the substrate comprises Mullite.

19. A method as in claim 1 wherein the substrate comprises molybdenum.

20. A method as in claim 1 wherein the substrate comprises tungsten.

21. A method as in claim 1 wherein the second cleave process comprises implanting particles into the GaN material.

22. A method as in claim 1 wherein the layer is freestanding.

23. A method as in claim 1 wherein the layer is transferred to a supporting substrate.

* * * * *